United States Patent
Yamakita et al.

(10) Patent No.: US 9,425,241 B2
(45) Date of Patent: Aug. 23, 2016

(54) ORGANIC ELECTROLUMINESCENCE DISPLAY UNIT, METHOD OF MANUFACTURING ORGANIC ELECTROLUMINESCENCE DISPLAY UNIT, AND COLOR FILTER SUBSTRATE

(71) Applicant: Joled Inc., Tokyo (JP)

(72) Inventors: Shigehiro Yamakita, Kanagawa (JP); Jiro Yamada, Kanagawa (JP); Takahide Ishii, Kanagawa (JP); Toshiaki Arai, Kanagawa (JP)

(73) Assignee: Joled Inc., Tokyo (JP)

( * ) Notice: Subject to any disclaimer, the term of this patent is extended or adjusted under 35 U.S.C. 154(b) by 5 days.

(21) Appl. No.: 13/784,258

(22) Filed: Mar. 4, 2013

(65) Prior Publication Data

US 2014/0077171 A1 Mar. 20, 2014

(30) Foreign Application Priority Data

Mar. 21, 2012 (JP) ................ 2012-063136

(51) Int. Cl.
| | | |
|---|---|---|
| H01L 33/52 | (2010.01) | |
| H01L 33/62 | (2010.01) | |
| H01L 27/32 | (2006.01) | |
| H01L 27/28 | (2006.01) | |
| H01L 51/56 | (2006.01) | |
| H01L 51/52 | (2006.01) | |
| G02B 5/20 | (2006.01) | |

(52) U.S. Cl.
CPC .............. *H01L 27/322* (2013.01); *G02B 5/201* (2013.01); *H01L 27/283* (2013.01); *H01L 27/3244* (2013.01); *H01L 51/525* (2013.01); *H01L 51/5228* (2013.01); *H01L 51/56* (2013.01); *H01L 51/5281* (2013.01); *H01L 2251/5315* (2013.01)

(58) Field of Classification Search
USPC .................. 257/99, E33.059, E33.06; 438/26
See application file for complete search history.

(56) References Cited

U.S. PATENT DOCUMENTS

| | | | | |
|---|---|---|---|---|
| 7,514,159 | B2 * | 4/2009 | Nakamura | H01L 51/0069 257/40 |
| 2002/0030193 | A1 * | 3/2002 | Yamazaki | H01L 51/5221 257/98 |
| 2003/0063229 | A1 * | 4/2003 | Takahashi et al. | 349/43 |
| 2003/0071956 | A1 * | 4/2003 | Sasaki et al. | 349/155 |
| 2007/0023837 | A1 * | 2/2007 | Lee | H01L 51/0545 257/347 |
| 2007/0159565 | A1 * | 7/2007 | Segawa | G02F 1/136209 349/38 |
| 2011/0108877 | A1 * | 5/2011 | Yamada et al. | 257/99 |

FOREIGN PATENT DOCUMENTS

| | | |
|---|---|---|
| JP | 2001-230086 | 8/2001 |
| JP | 2009-128671 | 6/2009 |
| JP | 2011-103205 | 5/2011 |

* cited by examiner

*Primary Examiner* — Mary Wilczewski
*Assistant Examiner* — Tsz Chiu
(74) *Attorney, Agent, or Firm* — K&L Gates LLP

(57) ABSTRACT

A display device includes a first electrode, an organic layer including a light emitting region, and a second electrode. The display device also includes a conductive layer electrically connected to the second electrode and including an opening corresponding to the light emitting region.

14 Claims, 34 Drawing Sheets

221B 221A
221

221B

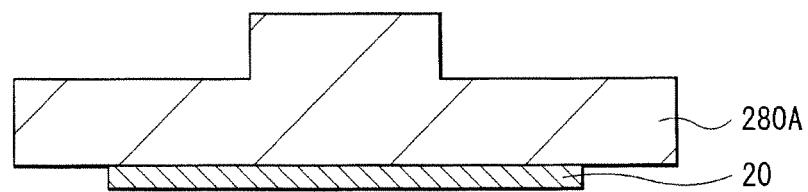
FIG. 12A
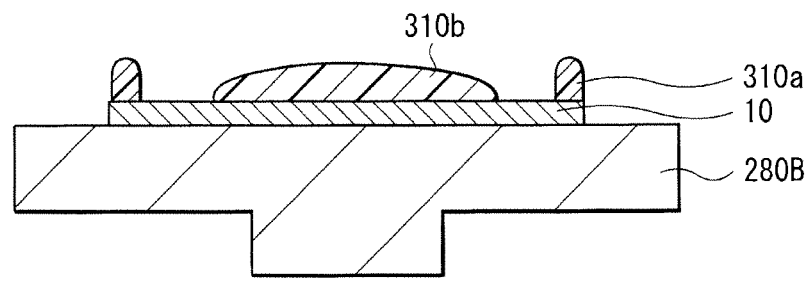
FIG. 12B
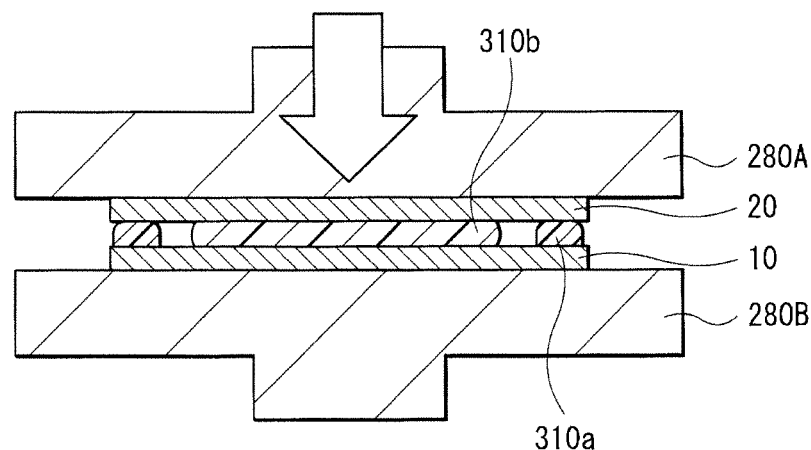
FIG. 12C
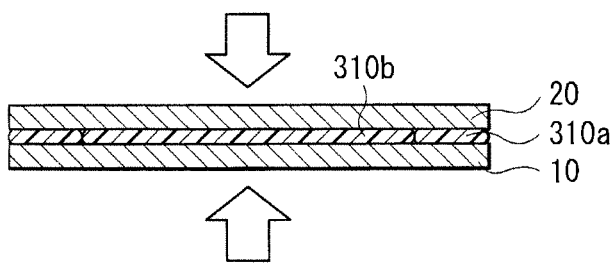

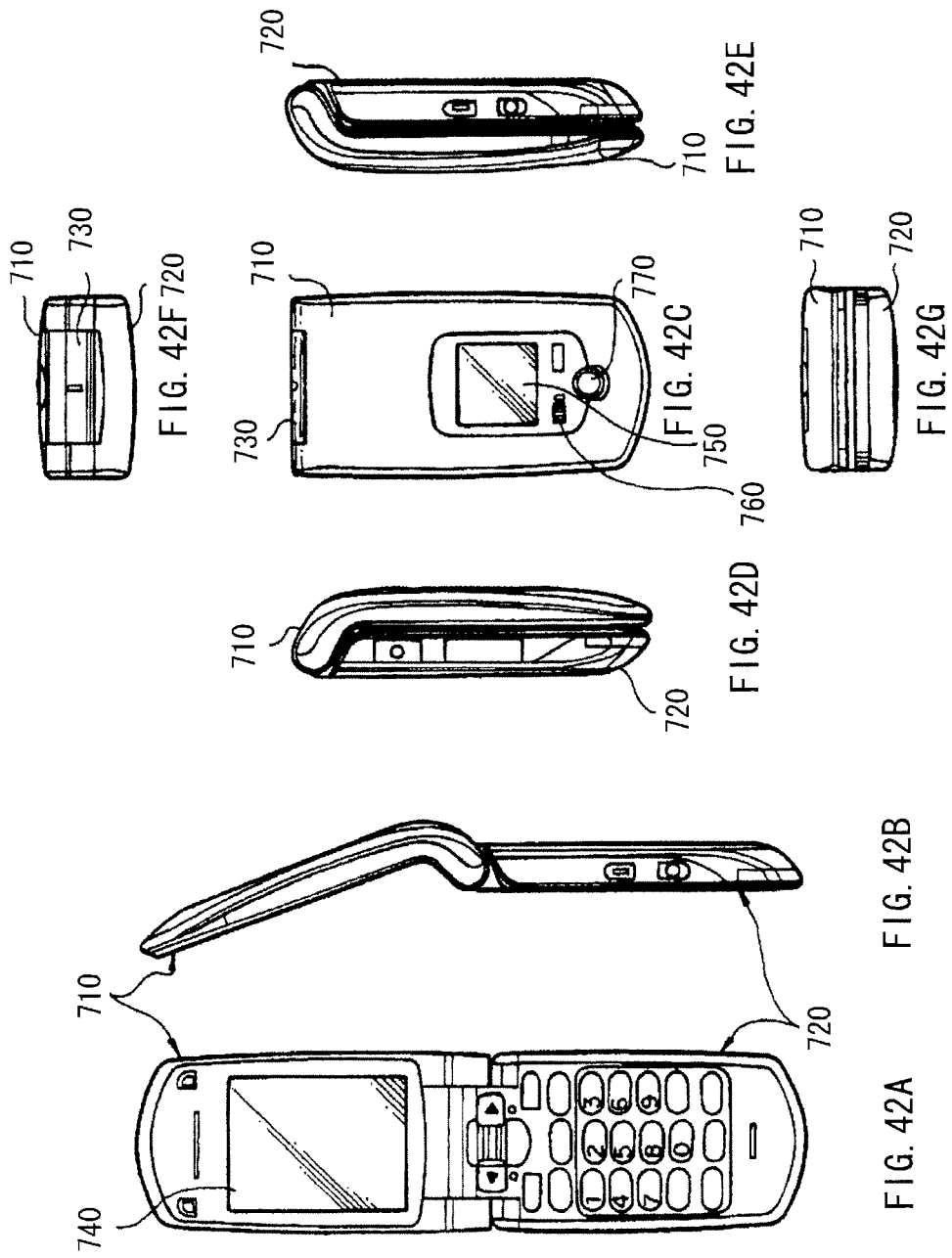

ORGANIC ELECTROLUMINESCENCE DISPLAY UNIT, METHOD OF MANUFACTURING ORGANIC ELECTROLUMINESCENCE DISPLAY UNIT, AND COLOR FILTER SUBSTRATE

CROSS REFERENCES TO RELATED APPLICATIONS

The present application claims priority to Japanese Priority Patent Application JP 2012-063136 filed Mar. 21, 2012 in the Japan Patent Office on, the entire content of which is hereby incorporated by reference.

BACKGROUND

The present disclosure relates to an organic electroluminescence (EL) display unit displaying an image with use of an organic EL effect, a method of manufacturing the same, and a color filter substrate used in such an organic EL display unit.

In recent years, as alternative to a liquid crystal display unit, attention is given to an organic electroluminescence display unit (hereinafter simply referred to as "organic EL display unit") using an organic electroluminescence device (hereinafter simply referred to as "organic EL device"). The organic EL display unit is of a self-luminous type, and has low power consumption. Moreover, since the organic EL display unit has a wide viewing angle, superior contrast, and sufficient responsivity with respect to high-definition high-speed video signals, the organic EL display unit has been actively developed and commercialized for practical use as a next-generation flat display unit. In particular, research on an active matrix (AM) type organic EL display unit including a thin film transistor (TFT) for light emission control in each pixel has been actively conducted.

In the case where such an active matrix type organic EL display unit is of a bottom emission type in which the TFT is disposed below an organic EL device and light is extracted from a bottom of the organic EL device, light passes only through a portion where the TFT is not disposed to exit from the organic EL display unit. Accordingly, an aperture ratio easily declines. On the other hand, in a top emission type organic EL display unit in which light is extracted from a top of the organic EL device, a decline in aperture ratio is suppressed; however, a transparent conductive film is used for an upper electrode (a counter electrode). Since the upper electrode is formed to have a thin thickness, the upper electrode has high resistance, thereby causing an IR drop (a voltage drop).

The IR drop is caused by the following reason. Although electrons or holes are supplied to each pixel through the upper electrode, a typical upper electrode is formed as a common electrode for respective pixels, and a feeding point to the upper electrode is provided only at an end of a substrate. Therefore, when a transparent conductive film having higher resistance than a current supply line to a lower electrode is used for the upper electrode, variations in wiring resistance according to a distance from the feeding point to each pixel are not negligible. Accordingly, when the distance between the feeding point and the pixel is increased, a drop in effective voltage applied to the organic EL device of each pixel is considerable, and variations in in-plane luminance are pronounced.

Therefore, there is proposed a technique of suppressing a drop in effective voltage through disposing an auxiliary power supply line made of a low-resistance material in a drive substrate where TFTs are disposed, and electrically connecting the auxiliary power supply line to an upper electrode to supply a current with use of the auxiliary power supply line (for example, refer to Japanese Unexamined Patent Application Publication No. 2001-230086). However, in this technique, it is necessary to avoid adhesion of an organic substance onto the auxiliary power supply line, and when an organic layer is formed of a low-molecular material by, for example, an evaporation method, a precisely processed evaporation mask covering an auxiliary electrode is necessary. A typical evaporation mask is formed by etching of a metal sheet with a thickness of approximately 10 □m to 100 □m or by electroforming. Even if any of these processing methods is used, it is difficult to form an evaporation mask with higher definition, and in particular, it is difficult to form an evaporation mask for a large-scale product. In addition, in the case where the precisely processed evaporation mask is used, it is necessary for the evaporation mask to be precisely aligned for evaporation. Since an increase in temperature is caused by radiant heat from an evaporation source during evaporation, misalignment or the like is easily caused by a difference in heat expansion coefficient between the evaporation mask and a substrate. It is difficult for such a technique to address an increase in size or definition of a panel.

On the other hand, when a configuration in which a common light-emitting layer (for example, white or blue) is provided for all pixels is adopted, it is not necessary to color-code light-emitting layers of pixels; therefore, a sufficiently large opening width is obtained, and the above-described precise processing of the evaporation mask is not necessary. Therefore, it is easy to cope with an increase in size or definition of the panel. However, power feeding to the upper electrode is possible only at the end of the substrate; therefore, variations in light emission luminance caused by the above-described IR drop are inevitable.

Therefore, there is proposed a top emission type organic EL display unit with a configuration in which an auxiliary electrode electrically connected to the upper electrode is included in a counter substrate (for example, refer to Japanese Unexamined Patent Application Publication No. 2011-103205).

SUMMARY

When the auxiliary electrode is formed in the counter substrate as in the case of the technique described in Japanese Unexamined Patent Application Publication No. 2011-103205, it is necessary to perform patterning of a conductive film material on the counter substrate. It is desirable to achieve a display unit capable of improving display quality through performing the patterning by a simple process with high precision, and in particular, reducing variations in light emission luminance caused by an increase in size or definition.

It is desirable to provide an organic electroluminescence (EL) display unit capable of improving display quality through reducing variations in light emission luminance caused by an increase in size or definition, a method of manufacturing the same, and a color filter substrate used in such an organic EL display unit.

In one embodiment, a display device includes a first electrode, an organic layer including a light emitting region, and a second electrode. The display device also includes a conductive layer electrically connected to the second electrode and including an opening corresponding to the light emitting region.

In another embodiment, a display apparatus includes a display device including a first electrode, an organic layer including a light emitting region, and a second electrode. The display device also includes a conductive layer electrically connected to the second electrode and including an opening corresponding to the light emitting region.

In another embodiment, an electronic device includes a display device including a first electrode, an organic layer including a light emitting region, and a second electrode. The electronic device also includes a conductive layer electrically connected to the second electrode and including an opening corresponding to the light emitting region.

In another embodiment, a method of manufacturing a display device includes forming a first electrode, an organic layer including a light emitting region, and a second electrode, and forming a conductive layer electrically connected to the second electrode and including an opening corresponding to the light emitting region.

Additional features and advantages are described herein, and will be apparent from the following Detailed Description and the figures.

BRIEF DESCRIPTION OF THE FIGURES

FIGS. 12A to 12C are sectional views for describing steps of bonding the device substrate and the counter substrate together.

FIGS. 42A to 42G illustrate Application Example 5, where FIGS. 42A and 42B are a front view and a side view in a state in which Application Example 5 is opened, respectively, and FIGS. 42C, 42D, 42E, 42F, and 42G are a front view, a left side view, a right side view, a top view, and a bottom view in a state in which Application Example 5 is closed, respectively.

DETAILED DESCRIPTION

Embodiments of the present application will be described below in detail with reference to the drawings. It is to be noted that description will be given in the following order.

1. First Embodiment (An example in which a laminate film including an inorganic light-shielding layer and a low-resistance layer is formed in a counter substrate, and the low-resistance layer and an upper electrode are electrically connected to each other through pillars)
2. Modification 1 (An example in which a resin light-shielding layer is formed on an inner wall of each opening)
3. Second Embodiment (An example in which the low-resistance layer is disposed on the resin light-shielding layer with a protective film in between in the counter substrate)
4. Modification 2 (An example in which a color filter layer is laminated to form a base of each pillar)
5. Modification 3 (An example in which a laminate of the color filter layer is used as a pillar)
6. Modification 4 (An example in which the low-resistance layer and the upper electrode are electrically connected to each other with use of conductive balls)
7. Modification 5 (An example in which a conductive resin is used for a sealing layer)
8. Entire Configuration Example of Display Unit and Pixel Circuit Configuration Example
9. Application Examples (Application examples to electronic apparatuses)

First Embodiment

Configuration

Figure 1:
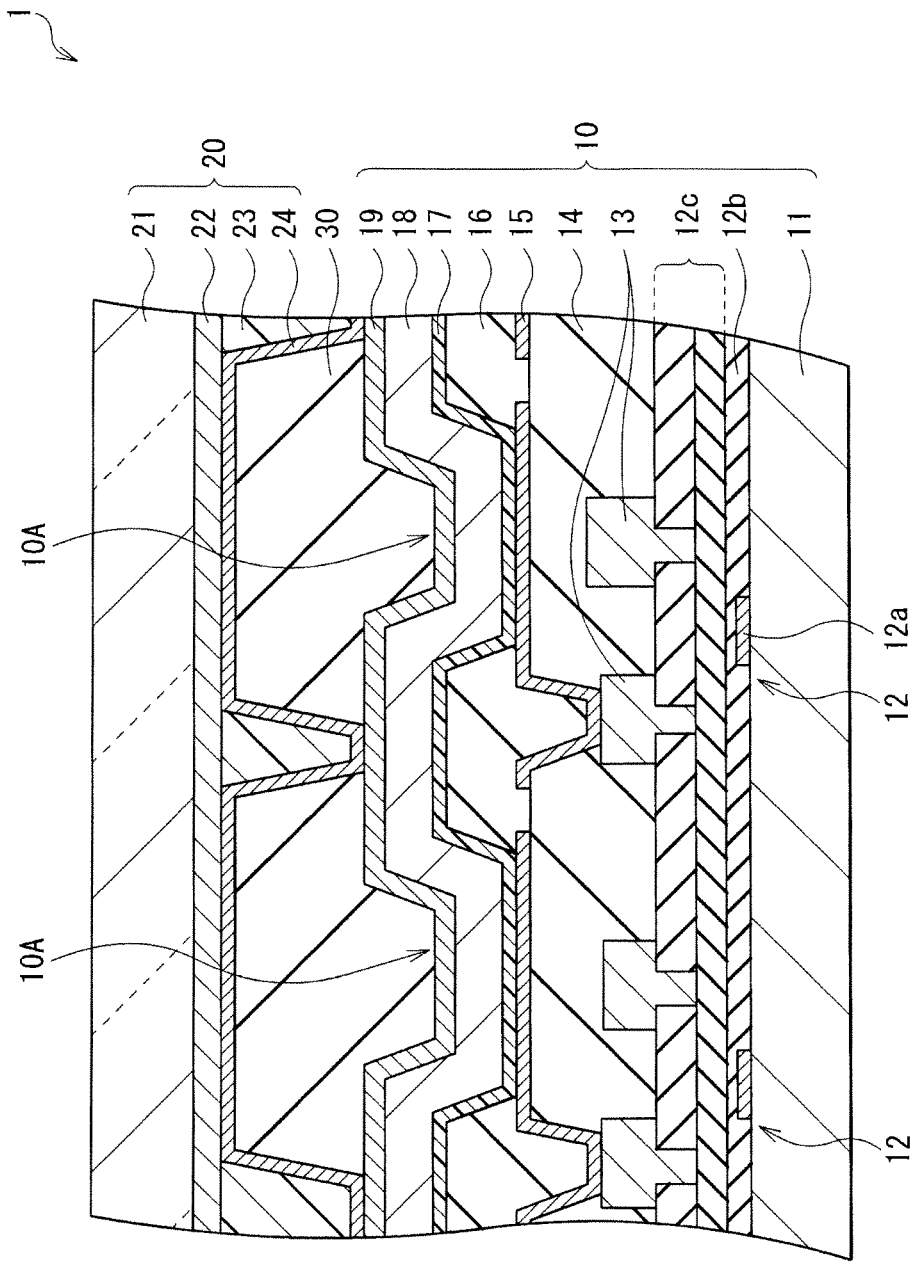
FIG. 1 is a sectional view illustrating a configuration of an organic EL display unit according to a first embodiment of the disclosure.

FIG. 1 illustrates a sectional configuration of an organic EL display unit (an organic EL display unit 1) according to a first embodiment of the disclosure. The organic EL display unit 1 is configured through bonding a counter substrate 20 onto a device substrate 10 including a plurality of organic EL devices 10A as pixels with a sealing layer 30 in between, and is a top emission type organic El display unit in which light is extracted from a top of the counter substrate 20. In the organic EL display unit 1, for example, each pixel is configured of sub-pixels of four colors, i.e., red (R), green (G), blue (B), and white (W).

(Device Substrate 10)

In the device substrate 10, a plurality of organic EL devices 10A as pixels configuring a display region (a display region 110 which will be described later) are arranged in, for example, a matrix form. For example, in the device substrate 10, a TFT 12 including a gate electrode 12a, a gate insulating film 12b, and a source electrode, a drain electrode, and a semiconductor layer which are not illustrated is disposed in each of the pixels. A wiring layer 13 is formed on the TFT 12 with an interlayer insulating film 12c in between. The wiring layer 13 is electrically connected to, for example, the source electrode or the drain electrode of the TFT 12 through a contact plug provided in the interlayer insulating film 12c. A pixel circuit including the TFT 12 and the wiring layer 13 is covered with an interlayer insulating film 14. In the device substrate 10, a plurality of organic EL devices 10A as pixels configuring the display region (the display region 110 which will be described later) are disposed on the interlayer insulating film 14.

The first substrate 11 is configured of, for example, a glass substrate or a plastic substrate. Examples of glass of the glass substrate include high-strain-point glass, soda-lime glass ($Na_2O.CaO.SiO_2$), borosilicate glass ($Na_2O.B_2O_3.SiO_2$), forsterite ($2MgO.SiO_2$), and lead glass ($Na_2O.PbO.SiO_2$). Alternatively, the first substrate 11 may be configured through forming an insulating film on a surface of any of these kinds of glass, or may be configured through forming an insulating film on a surface of quartz, silicon, metal, or the like. Examples of plastic of the plastic substrate include organic polymers such as poly(methyl methacrylate) (PMMA), polyvinyl alcohol (PVA), polyvinyl phenol (PVP), poly ether sulfone (PES), polyimide (PI), polycarbonate (PC) and polyethylene terephthalate (PET). It is to be noted that the plastic substrate includes a substrate in a film or sheet form with flexibility.

The TFT 12 corresponds to, for example, a transistor 3A or 3B in a pixel circuit 40 which will be described later. The TFT 12 may have, for example, an inverted stagger configuration (a bottom gate configuration) or a stagger configuration (a top gate configuration).

The interlayer insulating films 12c and 14 each are configured of a single-layer film made of one kind selected from: $SiO_2$-based inorganic materials such as silicon oxide ($SiO_2$), BPSG, PSG, BSG, AsSG, PbSG, SiON, SOG (spin-on glass), low-melting glass, and glass paste; SiN-based inorganic materials; and resin materials such as polyimide, or a laminate film made of two or more kinds thereof.

The wiring layer 13 is desirably made of a conductive metal, and desirably includes, for example, a metal with low contact resistance with respect to the lower electrode 15 or an oxide of such a metal in a surface in contact with the lower electrode 15.

The interlayer insulating film 14 is desirably made of a material similar to that of the above-described interlayer insulating film 12, and is desirably made of a material with favorable flatness.

The organic EL devices 10A each are configured through laminating, for example, the lower electrode 15, an organic layer 17 including a light-emitting layer, a resistance layer 18, and the upper electrode 19 in this order. The lower electrode 15 is electrically connected to the wiring layer 13 through a contact hole provided in the interlayer insulating film 14. In the device substrate 10, the plurality of organic EL devices 10A are separated by an inter-pixel insulating film 16 formed on the interlayer insulating film 14. More specifically, openings facing the lower electrodes 15 are formed in the inter-pixel insulating film 16, and the above-described laminate configuration including the lower electrode 15, the organic layer 17, the high-resistance layer 18, and the upper electrode 19 is formed in each of the openings. It is to be noted that a protective layer may be further formed on the upper electrode 19.

The lower electrode 15 is disposed in each of the organic EL devices 10A. For example, in the case where the lower electrode 15 functions as an anode, examples of the material of the lower electrode 15 include simple substances of metals with a high work function such as platinum (Pt), gold (Au), silver (Ag), chromium (Cr), tungsten (W), nickel (Ni), copper (Cu), iron (Fe), cobalt (Co), and tantalum (Ta), and alloys of such metals. Examples of the alloys include an Ag—Pd—Cu alloy including silver as a main component, approximately 0.3 wt % to 1 wt % both inclusive of palladium (Pd), and approximately 0.3 wt % to 1 wt % both inclusive of copper, and an Al—Nd alloy. Alternatively, the lower electrode 15 may have a laminate configuration including a metal film made of any one of the simple substances and alloys of the above-described metal elements and a transparent conductive film such as ITO. The lower electrode 15 is desirably made of a material with a high hole injection property; however, even if the lower electrode 15 is made of a material (aluminum (Al), an alloy including aluminum, or the like) other than the material with a high hole injection property, the lower electrode 15 is usable as an anode through including an appropriate hole injection layer. The lower electrode 15 has, for example, a thickness of approximately 10 nm to 1000 nm both inclusive. It is to be noted that, in the case where the organic EL display unit 1 is of a bottom emission type, the lower electrode 15 is configured of a transparent conductive film, for example, a single-layer film made of one kind selected from an oxide of indium and tin (ITO), indium zinc oxide (IZO), and an alloy of zinc oxide (ZnO) and aluminum (Al), or a laminate film including two or more kinds thereof.

The inter-pixel insulating film 16 ensures insulation between the lower electrode 15 and the upper electrode 19 of the organic EL device 10A, and separates respective pixel regions from one another. The inter-pixel insulating film 16 is desirably made of an insulating material having favorable flatness, and having a low water absorption rate to prevent degradation in the organic layer 17 caused by water, thereby maintaining light emission luminance, and the inter-pixel insulating film 16 is made of, for example, a polyimide resin, an acrylic resin, or a novolac region. The plurality of organic EL devices 10A are arranged in, for example, a stripe arrangement, a diagonal arrangement, a delta arrangement, or a rectangular arrangement according to an opening arrangement of the inter-pixel insulating film 16.

The organic layer 17 includes at least an organic electroluminescence layer (hereinafter simply referred to as "light-emitting layer"), and in the embodiment, the light-emitting layer (for example, a white light-emitting layer) is formed as a common layer for all pixels. Therefore, a process of color-coding respective pixels is removed. As the white light-emitting layer, a laminate of a blue light-emitting layer and a yellow light-emitting layer, a laminate of blue, green, and red light-emitting layers, or the like is used. The red light-emitting layer includes, for example, one or more of a red light-emitting material, a hole transport material, and an electron transport material, and is made of, for example, a material prepared through mixing 2,6-bis[(4'-methoxydiphenylamino)styryl]-1,5-dicyanonaphthalene (BSN) into 4,4-bis(2,2-diphenylvinyl)biphenyl (DPVBi). The green light-emitting layer includes one or more of a green light-emitting material, a hole transport material, and an electron transport material, and is made of, for example, a material prepared through mixing coumarin6 into ADN or DPVBi. The blue light-emitting layer includes one or more of a blue light-emitting material, a hole transport material, and an electron transport material, and is made of, for example, a material prepared through mixing 4,4'-bis[2-{4-(N,N-diphenylamino)phenyl}vinyl]biphenyl (DPAVBi) into DPVBi. In the organic layer 17, in addition to such a light-emitting layer, a hole injection layer, a hole transport layer, an electron transport layer, or the like may be laminated. Moreover, an electron injection layer made of, for example, an oxide or a complex oxide of lithium (Li), cesium (Cs), calcium (Ca), barium (Ba), indium (In), magnesium (Mg), or the like may be included between the electron transport layer and the upper electrode 19. Further, a combination of these laminate configurations are referred to as "unit" ("tandem unit" for convenience sake), and two or more tandem units may be laminated with a connection layer in between.

The high-resistance layer 18 is disposed between the organic layer 17 and the upper transparent electrode 19, and is made of a transparent material with high electrical resistivity, for example, niobium oxide ($Nb_2O_5$), ITO, or IZO. When a voltage is applied between the lower electrode 15 and the upper electrode 19, the high-resistance layer 18 suppresses a short circuit between the lower electrode 15 and the upper electrode 19 caused by, for example, a foreign substance, thereby preventing generation of a defective pixel or a missing line. The electrical resistivity of the high-resistance layer 18 is desirably, for example, approximately $1 \times 10^6$ Ω·m to $1 \times 10^8$ Ω·m both inclusive. However, the high-resistance layer 18 may be optionally included; therefore, the upper electrode 19 may be formed directly on the organic layer 17.

The upper electrode 19 is electrically connected to the organic layer 17 through the high-resistance layer 18, and is commonly provided for the plurality of organic EL devices 10A. Since the organic EL display unit 1 is of a top emission type in the embodiment, the upper electrode 19 is configured of a transparent conductive film. Examples of the transparent conductive film include a single-layer film made of one kind selected from an oxide of indium and tin (ITO), InZnO (indium zinc oxide), and an alloy of zinc oxide (ZnO) and aluminum (Al), or a laminate film including two or more kinds thereof. The upper electrode 19 has, for example, a thickness of approximately 10 nm to 500 nm. In this case, the above-described transparent conductive film has high resistance; therefore, typically, to suppress a voltage drop, it is necessary for the transparent conductive film to have a larger thickness, thereby reducing sheet resistance. However, the larger thickness may impair optical characteristics. On the other hand, in the embodiment, as will be described later, a voltage drop is suppressed by a low-resistance layer 221B included in the counter substrate 20; therefore, the upper electrode 19 has a smaller thickness, and favorable optical characteristics are obtainable.

The high-resistance layer 18 and the upper electrode 19 also function as protective films preventing water from reaching the organic layer 17, and a protective layer (not illustrated) may be formed on the upper electrode 19, if necessary. The protective layer may be made of an insulating material or a conductive material. As the insulating material, an inorganic amorphous insulating material, for example, amorphous silicon (a-Si), amorphous silicon carbide (a-SiC), amorphous silicon nitride ($a-Si_{1-x}Nx$), amorphous carbon (a-C), or the like is preferable. Since such an inorganic amorphous insulating material does not form grains, the inorganic amorphous insulating material has low permeability and forms a favorable protective layer. The protective layer is desirably formed especially with use of a film formation method in which film-forming particles have small energy, such as a vacuum deposition method, or a CVD (Chemical Vapor Deposition) method, since an influence exerted on a base is reduced. Moreover, to prevent degradation in the organic layer 17, the protective layer is desirably formed under conditions that a film formation temperature is set at a room temperature, and stress on the protective layer is minimized to prevent peeling of the protective film. Further, the protective layer is desirably formed without exposing the upper electrode 19 to air, thereby preventing degradation in the organic layer 17 caused by water or oxygen in air. It is to be noted that, in the case where the protective layer made of such an insulating material is formed, it is necessary to form a contact hole for electrically connecting the upper electrode 19 to the low-resistance layer 221B which will be described later.

(Sealing Layer 30)

The sealing layer 30 seals the device substrate 10, and functions as an adhesive layer between the device substrate 10 and the counter substrate 20. The sealing layer 30 is formed to prevent water from externally entering the organic layer 17 and to increase mechanical strength. The sealing layer 30 is made of, for example, an ultraviolet (UV) curable resin or a thermosetting resin, and in the embodiment, an insulating resin is used. The sealing layer 30 includes a resin layer 310a formed in an outer region of the substrate as a dam member (an outer wall) and a resin layer 310b formed in a region surrounded by the resin layer 310a (both not illustrated in FIG. 1). It is to be noted that the transmittance with respect to light emitted from the organic layer 17 of the resin layer 310b facing the organic EL device 10A is desirably approximately 80% or over. On the other hand, the transmittance of the resin layer 310a as the dam member is not specifically limited; however, it is important for the resin layer 310a to have low water permeability. In FIG. 1, as the sealing layer 30, a portion corresponding to a part of the resin layer 310b is illustrated.

The sealing layer 30 preferably has, for example, a thickness of approximately 3 µm to 20 µm both inclusive. When the sealing layer 30 has a thickness of approximately 20 µm or less, a distance between the organic EL device 10A and a color filter layer which will be described later is appropriately maintained, and a difference in luminance or chromaticity between when a display plane is viewed from an oblique direction and when the display plane is viewed from a front direction is suppressed, and favorable viewing angle characteristics are obtainable Moreover, when the sealing layer 30 has a thickness of approximately 3 µm or over, even if a foreign substance is trapped at the time of sealing, generation of dark spots caused when the foreign substance applies pressure to the organic EL device 10A is suppressed.

It is to be noted that, as will be described in detail later, the sealing layer 30 has a gap (a buffer layer) between the resin layers 310a and 310b, and a light-shielding pattern 311 is formed to face the gap. Moreover, in the case where an insulating resin is used for the sealing layer 30 as in the embodiment, the amount of the resin filled in a sealing process is preferably approximately 100% to 120% both inclusive with respect to a sealing volume.

(Counter Substrate 20)

The counter substrate 20 is configured through forming a CF/BM layer 22 including a color filter and a black matrix on a surface (a surface located closer to the device substrate 10) of the second substrate 21. In the CF/BM layer 22, pillars 23 are disposed in predetermined positions, and a conductive film 24 is formed to cover the CF/BM layer 22 and the pillars 23. The second substrate 21 is made of a material similar to that of the above-described first substrate 11, and may be made of a material same as or different from that of the first substrate 11; however, the second substrate 21 is made of a material having transparency.

Figure 2:
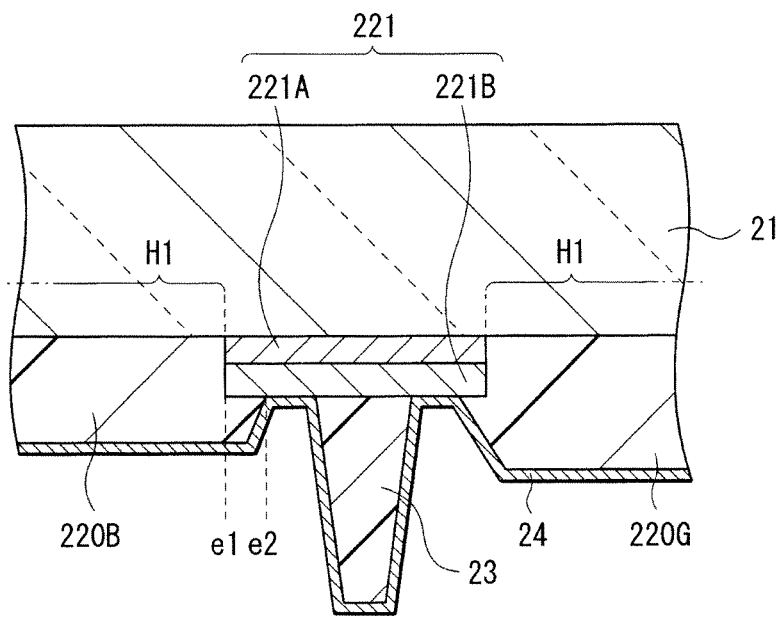
FIG. 2 is a sectional view illustrating a specific configuration of a counter substrate illustrated in FIG. 1.
Figure 3:
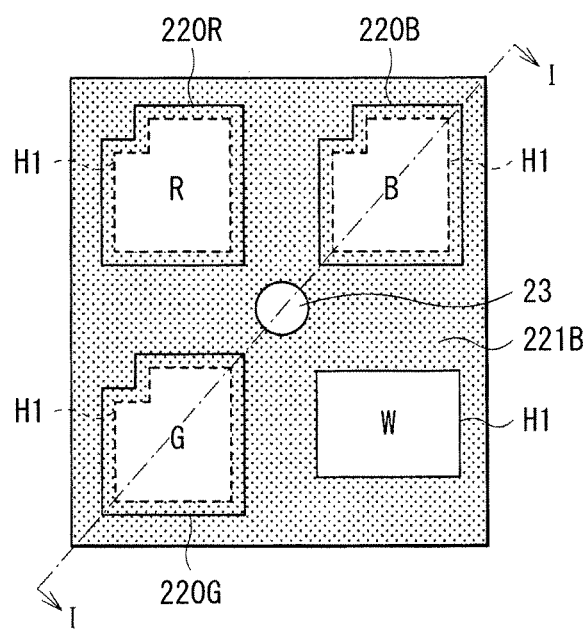
FIG. 3 is a schematic plan view illustrating a configuration of a main part of the counter substrate illustrated in FIG. 1.

FIG. 2 illustrates an enlarged view of a configuration around the pillar 23 of the counter substrate 20. FIG. 3 illustrates a configuration of the counter substrate 20 as seen from the sealing layer 30, though the conductive film 24 is not illustrated in FIG. 3. It is to be noted that FIG. 2 is a sectional view taken along a line I-I of FIG. 3.

A laminate film 221 including an inorganic light-shielding layer 221A and the low resistance layer 221B (a conductive layer) is formed on the surface of the counter substrate 20. In the laminate film 221, openings H1 penetrating through the inorganic light-shielding layer 221A and the low-resistance layer 221B are disposed to face respective organic EL devices 10A. One of a red resin layer 220R, a green resin layer 220G, and a blue resin layer 220B configuring a color filter is formed to be filled in each of the openings H1. More specifically, in the embodiment, as described above, each pixel is configured of four sub-pixels of R, G, B, and W; therefore, for example, the four sub-pixels are arranged in a 2×2 arrangement, and the red resin layer 220R, the green resin layer 220G, and the blue resin layer 220B each are formed in one of four openings H1. It is to be noted that it is not necessary to dispose a color filter for the sub-pixel of W; however, a transmittance control filter for luminance adjustment may be disposed for the sub-pixel of W, if necessary.

The red resin layer 220R, the green resin layer 220G, and the blue resin layer 220B (hereinafter collectively referred to as "color filter layers" in some cases) are filled in respective openings H1 of the laminate film 221, and are formed to overlap an edge e1 of the low-resistance layer 221B. In other words, an edge e2 of each of the red resin layer 220R, the green resin layer 220G, and the blue resin layer 220B is formed to cover the edge e1 of the laminate film 221. Each of the pillars 23 is disposed in a selective region (in this case, a center surrounded by four sub-pixels) on the low-resistance layer 221B exposed from the red resin layer 220R, the green resin layer 220G, and the blue resin layer 220B. The conductive film 24 is formed to cover the red resin layer 220R, the green resin layer 220G, the blue resin layer 220B, the low-resistance layer 221B, and the pillars 23. Configurations of respective components of the counter substrate 20 will be described in detail below.

The laminate film 221 is configured through laminating one or a plurality of inorganic films, and has a light-blocking effect and conductivity. In the embodiment, a layer mainly exhibiting the light-blocking effect (the inorganic light-shielding layer 221A) and a layer mainly exhibiting conductivity (the low-resistance layer 221B) are laminated, and the inorganic light-shielding layer 221A and the low-resistance layer 221B are formed in the same pattern as each other on the second substrate 21. In other words, a laminate configuration including a plurality of inorganic films achieves the light-blocking effect as a black matrix and a function as an auxiliary electrode of the upper electrode 19.

The inorganic light-shielding layer 221A is configured of, for example, an inorganic multilayer film, and ensures the light-blocking effect with use of a light interference phenomenon. The material of each of inorganic films configuring the inorganic light-shielding layer 221A is not specifically limited, and may have conductivity or insulation, and to give an example, each of the inorganic films is made of, for example, a simple substance, an oxide, a nitride, or an oxynitride of a metal or silicon (Si). It is good enough for the inorganic light-shielding layer 221A to ensure a sufficient light-blocking effect through appropriately determining the refractive index, absorption coefficient, film thickness, and the like of each film. It is to be noted that a material having both the light-blocking effect and conductivity, for example, chromium (Cr), graphite (C), or the like may be used; however, a multilayer configuration separately having functions of the light-blocking effect and conductivity is desirably formed in terms of ensuring of the light-blocking effect and low resistance.

As an example of such an inorganic light-shielding layer 221A, a three-layer laminate film of SiN (65 nm)/a-Si (amorphous silicon) (20 nm)/Mo (50 nm) is used. In this laminate configuration, when the thickness of the SiN layer is within a range of + (plus) 8% to − (minus) 8% both inclusive of the above-described thickness (65 nm), or when the thickness of the a-Si layer is within a range of + (plus) 12% to − (minus) 12% both inclusive of the above-described thickness (20 nm), a similar level of the light-blocking effect is ensured. Moreover, when an inorganic film with a higher refractive index is formed instead of the SiN layer, a margin of its film thickness is improved. Alternatively, a four-layer laminate film of $MoO_x$ (45 nm)/Mo (10 nm)/$MoO_x$ (40 nm)/Mo (50 nm) in order from a side closer to the second substrate 21 may be used. On the other hand, an allowable range of each of the thicknesses of the Mo layer and the $MoO_x$ layer is from +15% to −15% both inclusive. Further, when $MoN_x$ is used instead of Mo, its thickness is further increased. It is to be noted that a value in each parenthesis indicates a film thickness of each layer. These configurations each include the Mo layer on a surface side (a side closer to the low-resistance layer 221B), and the thickness of the Mo layer may be approximately 50 nm or over. Moreover, a metal other than Mo may be laminated. Thus, the light-blocking effect and conductivity are ensured more easily.

The low-resistance layer 221B functions as an auxiliary electrode of the upper electrode 19, and is made of a material with a thickness allowing its electrical resistivity to be lower than that of the upper electrode 19 (a transparent conductive film). In the embodiment, the low-resistance layer 221B is laminated on the inorganic light-shielding layer 221A, and has the same pattern shape (a pattern shape including the openings H1) as that of the inorganic light-shielding layer 221A.

The low-resistance layer 221B is connected to a cathode contact section disposed in a peripheral region of a pixel section, for example, in the case where the lower electrode 15 is an anode and the upper electrode 19 is a cathode. Thus, a current taken from the upper electrode 19 returns to a power supply located closer to the device substrate 10 through the low-resistance layer 221B and the cathode contact section. It is to be noted that the cathode contact section may be formed in the device substrate 10 or the counter substrate 20. However, the cathode contact section is preferably formed in the counter substrate 20, since the taken current is returned as it is to the cathode contact section in the counter substrate 20, and a resistance difference is smaller than that in the case where the current is returned to the device substrate 10. It is to be noted that, even if the lower electrode 15 is a cathode, a configuration in which an anode contact section is formed in the peripheral region of the pixel section in a similar manner is electrically equivalent.

The low-resistance layer 221B is formed through laminating one or a plurality of inorganic films, and desirably uses, for example, a material with lower resistivity than molybdenum, for example, one or more kinds of aluminum (Al), silver (Ag), gold (Au), copper (Cu), chromium, zinc (Zn), iron (Fe), tungsten (W), cobalt (Co), and the like. However, in the case where a material with high reactivity is used, a layer made of molybdenum, titanium, or the like may be formed on an outermost surface.

To sufficiently suppress a voltage drop, the thickness of the low-resistance layer 221B is appropriately determined according to characteristics of the organic EL display unit, and is preferably within a range of approximately 100 nm to 1000 nm both inclusive. In terms of conductivity characteristics, the thickness is preferably approximately 100 nm or over, and in terms of a load of a film forming process, the thickness is preferably approximately 1000 nm or less.

As an example of such a low-resistance layer 221B, a two-layer laminate film of Al (300 nm)/Mo (50 nm) in order from a side closer to the inorganic light-shielding layer 221A is used. Alternatively, a three-layer laminate film of Mo (50 nm)/Al (300 nm)/Mo (50 nm), or a single-layer film of Ag alloy (300 nm) may be used. It is to be noted that the Mo layer (50 nm) on a surface side of the laminate film configuration described above as an example of the inorganic light-shielding layer 221A has both the light-blocking effect and conductivity; therefore, in actuality, the Mo layer also functions as a part of the low-resistance layer 221B.

The red resin layer 220R, the green resin layer 220G, and the blue resin layer 220B each are a color filter allowing light with a specific wavelength region to selectively pass therethrough (a color filter absorbing light with a wavelength region other than the specific wavelength region). Therefore, each sub-pixel converts white light emitted from the organic layer 17 into color light of R, G, or B to emit the color light. However, the sub-pixel of W (a high-luminance pixel) extracts white light emitted from the organic layer 17 as it is without absorbing the light by the color filter. The red resin layer 220R, the green resin layer 220G, and the blue resin layer 220B each are made of, for example, a photosensitive resin into which a dye or a pigment is mixed. Moreover, the thickness of each of the red resin layer 220R, the green resin layer 220G, and the blue resin layer 220B is appropriately determined according to necessary chromaticity or the like, and is, for example, within a range of approximately, 0.1 μm to 5 μm both inclusive.

The pillars 23 each function as a spacer between the device substrate 10 and the counter substrate 20, and as will be described in detail later, the pillars 23 each are a member allowing the low-resistance layer 221B of the laminate film 221 and the upper electrode 19 of the device substrate 10 to be electrically connected to each other. Therefore, the pillars 23 are desirably made of a material with conductivity; however, the pillars 23 may be made of an insulating material as in the case of the embodiment. For example, the pillars 23 are formed with use of a photosensitive resin such as a photoresist, and surfaces of the pillars 23 are covered with the conductive film 24. In this case, the pillars 23 are formed on the laminate film 221 to be sufficiently projected from the red resin layer 220R, the green resin layer 220G, and the blue resin layer 220B. The pillars 23 and the conductive film 24 covering the pillars 23 are specific examples of a conductive member in one embodiment of the present disclosure.

A plurality of pillars 23 are disposed in a plane of the counter substrate 20. Therefore, the pillars 23 desirably have elasticity to an extent or higher by which variations in heights of the plurality of pillars 23 are absorbed. When the pillars 23 are formed with different heights, at the time of sealing, a section first coming in contact with the upper electrode 19 (the pillar 23 with a larger height) and a section coming in contact with the upper electrode 19 later (the pillar 23 with a smaller height) are formed. When the pillars 23 have sufficient elasticity, the pillar 23 with a larger height may be shrunk by elastic deformation to come in contact with the upper electrode 19, and a cell gap is determined according to the height of the pillar 23 with a smaller height. Even if the pillars 23 have different heights, the entire surface of the counter substrate 20 comes in contact with the top electrode 19. Moreover, since the pillars 23 have elasticity, the occurrence of a crack caused by variations in height is suppressed.

The conductive film 24 is configured of, for example, a transparent conductive film of ITO or the like, and has, for example, a thickness of approximately 10 nm to 5000 nm both inclusive. It is to be noted that, in this case, the conductive film 24 covers not only the surfaces of the pillars 23 but also surfaces of the red resin layer 220R, the green resin layer 220G, and the blue resin layer 220B; therefore, the conductive film 24 has transparency, but the conductive film 24 does not necessarily have transparency. In other words, since it is only necessary for the low-resistance layer 221B and the upper electrode 19 to be electrically connected to each other through the pillars 23, in the case where the pillars 23 are made of an insulating material, it is only necessary for the conductive film 24 to be formed over at least the surfaces of the pillars 23 and a part of the surface of the low-resistance layer 221B (for example, a peripheral region of each of the pillars 23). In this manner, the conductive film 24 may be disposed only on the pillars 23 and local regions around the pillars 23. In this case, since the conductive film 24 is formed below the inorganic light-shielding layer 221A, the conductive film 24 is not limited to the transparent conductive film, and may be formed with use of another metal material, for example, a material similar to that of the above-described low-resistance layer 221B.

(Electrical Connection Between Upper Electrode 19 and Low-Resistance Layer 221B)

In the embodiment, as described above, the laminate film 221 including the inorganic light-shielding layer 221A and the low-resistance layer 221B is included on the second substrate 21, and the red resin layer 220R, the green resin layer 220G, and the blue resin layer 220B are formed in respective openings H1 of the laminate film 221. The pillars 23 are disposed on the low-resistance layer 221B of the laminate film 221 to be projected from the red resin layer 220R, the green resin layer 220G, and the blue resin layer 220B, and an entire surface of the second substrate 21 including the pillars 23 and the low-resistance layer 221B is covered with the conductive film 24. The conductive film 24 and the upper electrode 19 of the device substrate 10 come in contact with each other at top edges of the pillars 23. Therefore, the upper electrode 19 and the low-resistance layer 221B are electrically connected to each other through the pillars 23 and the conductive film 24 (a conductive pillar).

In the case where electrical connection between the upper electrode 19 and the low-resistance layer 221B is ensured with use of the pillars 23, the pillars 23 are formed in the counter substrate 20 in advance; therefore, connection positions are clearly specified.

[Manufacturing Method]

The above-described organic EL display unit 1 is manufactured by the following steps, for example. FIGS. 4A and 4B to FIGS. 12A, 12B, and 12C illustrate steps of manufacturing the organic EL display unit 1.

(Fabrication of Device Substrate 10)

Figure 4A:
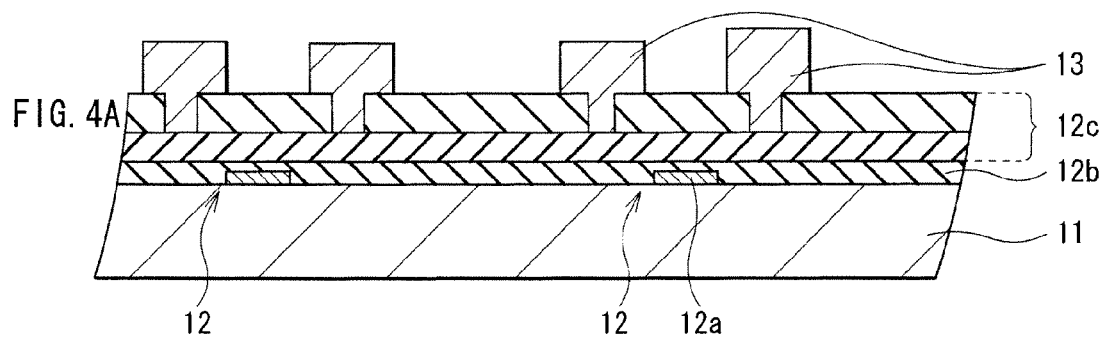
FIGS. 4A and 4B are sectional views for describing steps of forming a device substrate illustrated in FIG. 1.

First, the device substrate 10 is fabricated. More specifically, as illustrated in FIG. 4A, the gate electrode 12a, the gate insulating film 12b, the interlayer insulating film 12c, and the like are formed in order on the first substrate 11, by a known thin film formation process, to form the TFT 12, and then the wiring layer 13 bringing the TFT 12 into conduction is formed.

Figure 4B:
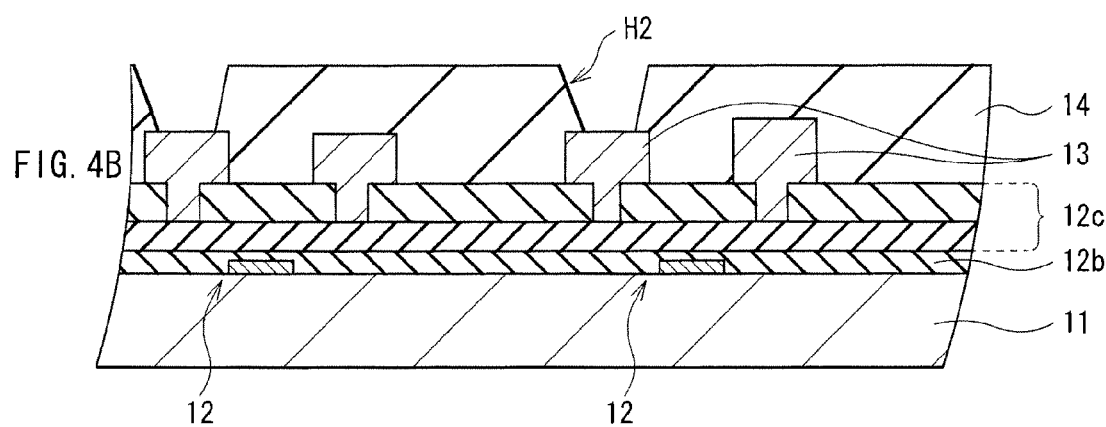

Next, as illustrated in FIG. 4B, the interlayer insulating film 14 is formed. More specifically, first, the interlayer insulating film 14 made of the above-described material is formed on an entire surface of the substrate with use of, for example, a CVD method, a coating method, a sputtering method, or any of various printing methods. After that, contact holes H2 are formed in regions facing the wiring layer 13 of the interlayer insulating film 14 by, for example, etching with use of a photolithography method.

Figure 5A:
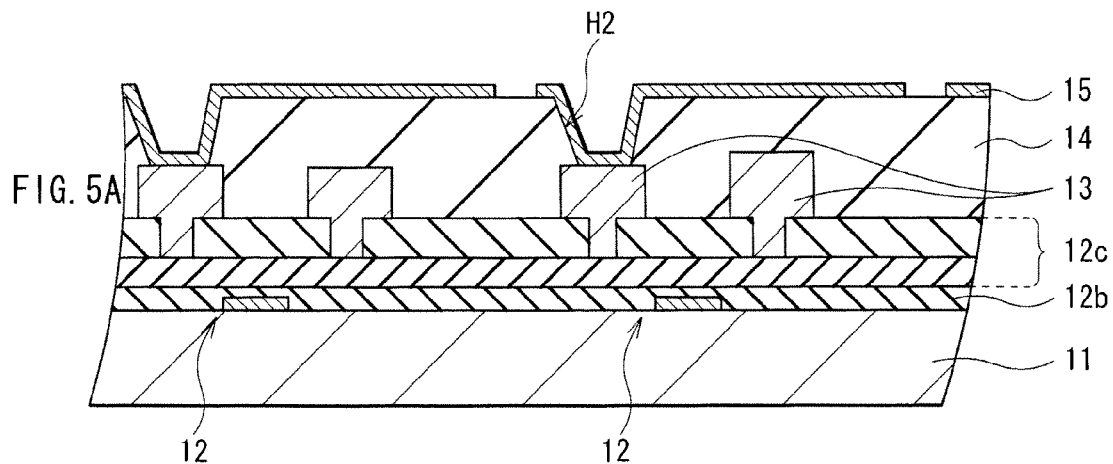
FIGS. 5A and 5B are sectional views illustrating steps following FIGS. 4A and 4B.

Next, as illustrated in FIG. 5A, the lower electrode 15 is formed. First, the lower electrode 15 made of the above-described material is formed on the interlayer insulating film 14 by, for example, the sputtering method to be filled in the contact holes H2. After that, the formed lower electrode 15 is patterned into a predetermined shape, and is separated into parts for respective pixels by etching with use of for example, the photolithography method.

Figure 5B:
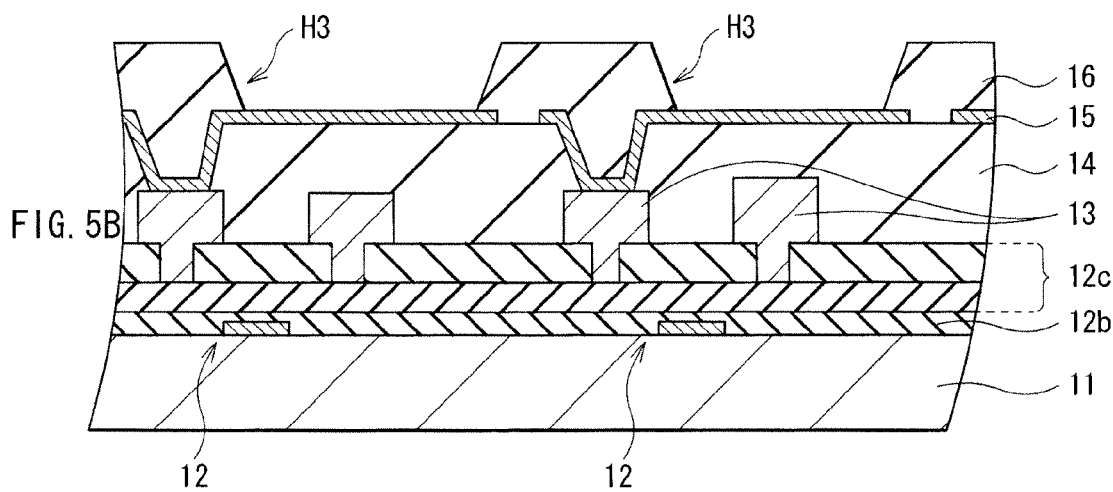

Then, as illustrated in FIG. 5B, the inter-pixel insulating film 16 is formed. First, the inter-pixel insulating film 16 made of the above-described material is formed on the entire surface of the substrate, and then openings H3 are formed in regions corresponding to the lower electrodes 15. At this time, in the case where a photosensitive resin is used for the inter-pixel insulating film 16, after the inter-pixel insulating film 16 is formed, the openings H3 can be formed by exposure to light with use of a photomask. Moreover, after the openings H3 are formed, reflow may be performed, if necessary. The openings H3 each correspond to a so-called light emission region (a pixel opening) of each pixel.

Figure 6A:
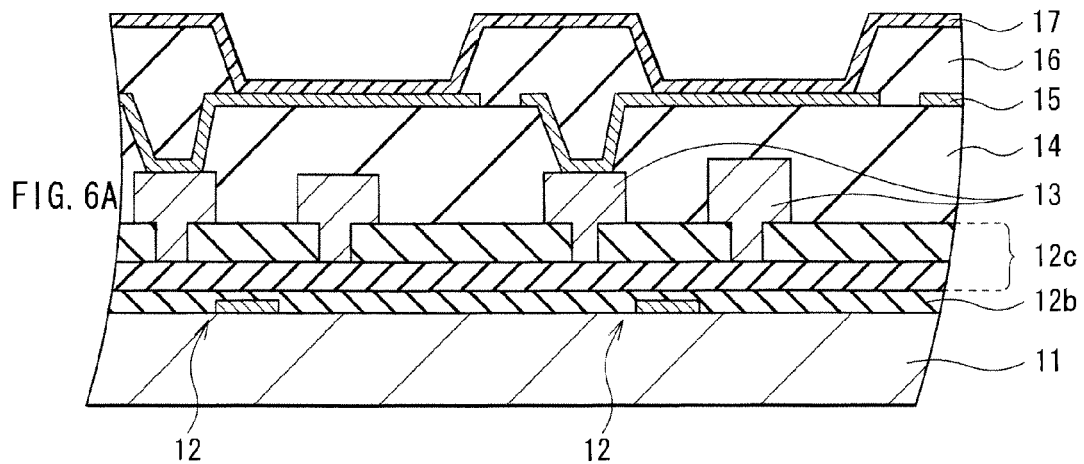
FIGS. 6A and 6B are sectional views illustrating steps following FIGS. 5A and 5B.

Next, as illustrated in FIG. 6A, the organic layer 17 is formed. In the embodiment, as described above, since a common light-emitting layer (for example, a white light-emitting layer) is formed for respective pixels, for example, films of red, green, and blue light-emitting materials are formed on the entire surface of the substrate in order by, for example, the vacuum deposition method. Alternatively, as a method of forming the organic layer 17, in addition to the vacuum deposition method, printing methods such as a screen printing method and an ink jet printing method and the coating method may be used. Moreover, a laser transfer method may be used. In the laser transfer method, a laminate of a laser light absorption layer and an organic layer may be formed on a substrate for transfer, and laser may be applied to the substrate for transfer to separate and transfer the organic layer from the substrate for transfer. It is to be noted that, when a hole transport layer, an electron transport layer, or the like is formed in addition to the above-described light-emitting layer, the layers are desirably formed together with the light-emitting layer by vacuum in-situ processing.

Figure 6B:
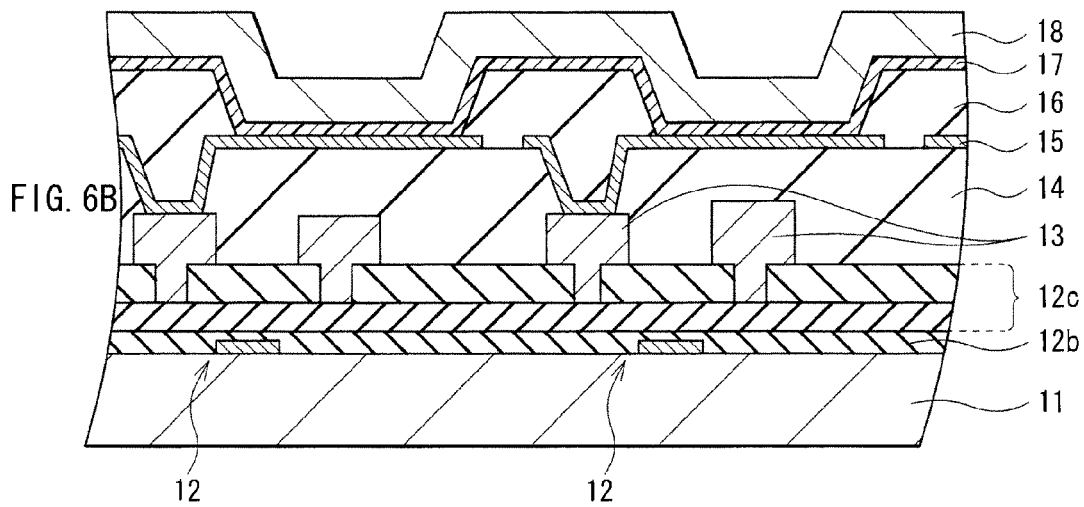

Next, as illustrated in FIG. 6B, the high-resistance layer 18 made of the above-described material is formed on an entire surface of the organic layer 17 by, for example, the sputtering method, an evaporation method, or the CVD method.

Figure 7:
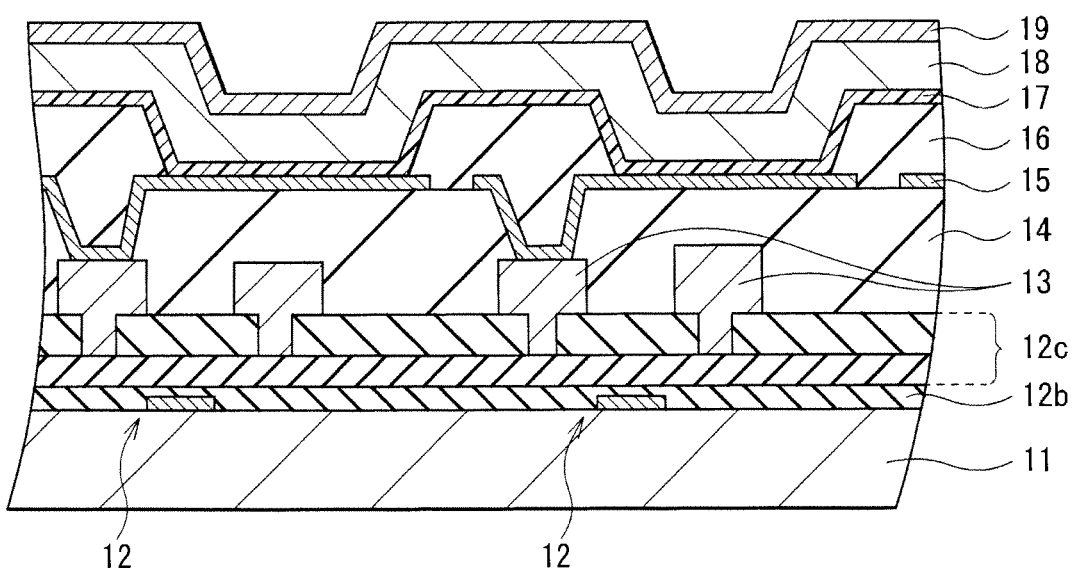
FIG. 7 is a sectional view illustrating a step following FIGS. 6A and 6B.

Next, as illustrated in FIG. 7, the upper electrode 19 configured of the above-described transparent conductive film is formed on the entire surface of the substrate by, for example, the sputtering method. It is to be noted that, after the upper electrode 19 is formed, a protective layer (not illustrated) may be formed by, for example, the evaporation method or the CVD method. Thus, the device substrate 10 is formed.

(Fabrication of Counter Substrate 20)

On the other hand, the counter substrate 20 is fabricated by the following steps, for example. It is to be noted that FIGS. 8A and 8B to FIGS. 11A and 11B illustrate steps of fabricating the counter substrate 20, and FIGS. 8A to 11A are enlarged sectional views corresponding to the configuration in FIG. 2, and FIGS. 8B to 11B are schematic plan views corresponding to the configuration in FIG. 3. Moreover, a shaded part in each of FIGS. 8B to 11B corresponds to a region where the low-resistance layer 221B (the laminate film 221) is formed.

Figure 8A:
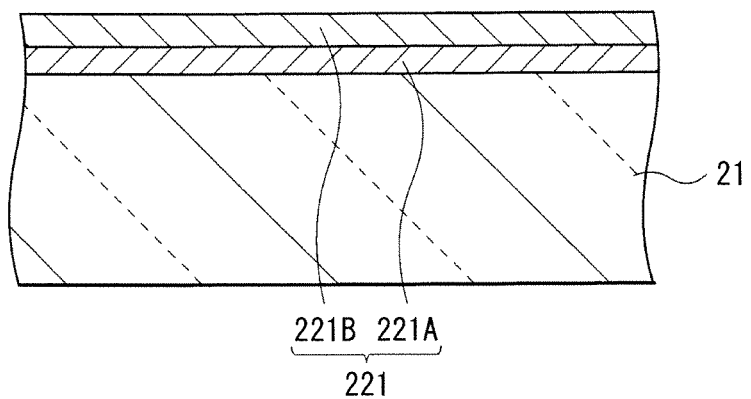
FIGS. 8A and 8B are a sectional view and a plan view, respectively, for describing a step of forming the counter substrate illustrated in FIG. 1.
Figure 8B:
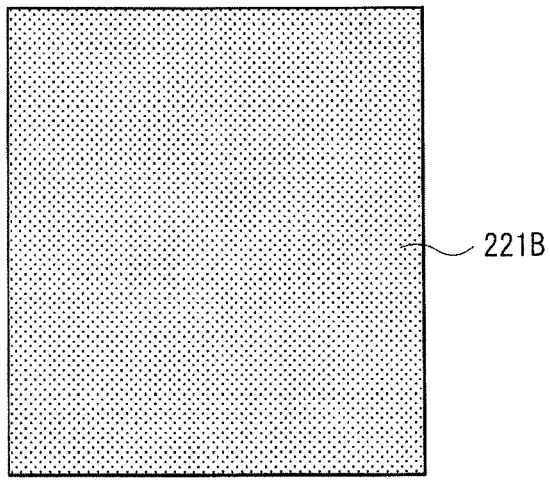

More specifically, first, as illustrated in FIGS. 8A and 8B, the laminate film 221 is formed on the second substrate 21. At this time, first, the inorganic light-shielding layer 221A having the above-described laminate configuration, materials, thickness, and the like are formed on the second substrate 21 by, for example, the sputtering method or the CVD method. For example, in the case where a three-layer laminate film of SiN/a-Si/Mo as one of the above-described laminate film configuration examples is formed, first, a SiN layer and an a-Si layer are formed in this order by, for example, the CVD method, and then an Mo layer is formed by, for example, the sputtering method. Alternatively, in the case where a four-layer laminate film of $MoO_x/Mo/MoO_x/Mo$ is formed, respective layers may be sequentially formed by, for example, the sputtering method. Next, the low-resistance layer 221B having the above-described laminate configuration, materials, thickness, and the like is formed on the inorganic light-shielding layer 221A by, for example, the sputtering method. Thus, the laminate film 221 configured of the inorganic light-shielding layer 221A and the low-resistance layer 221B is formed on an entire surface of the second substrate 21.

Figure 9A:
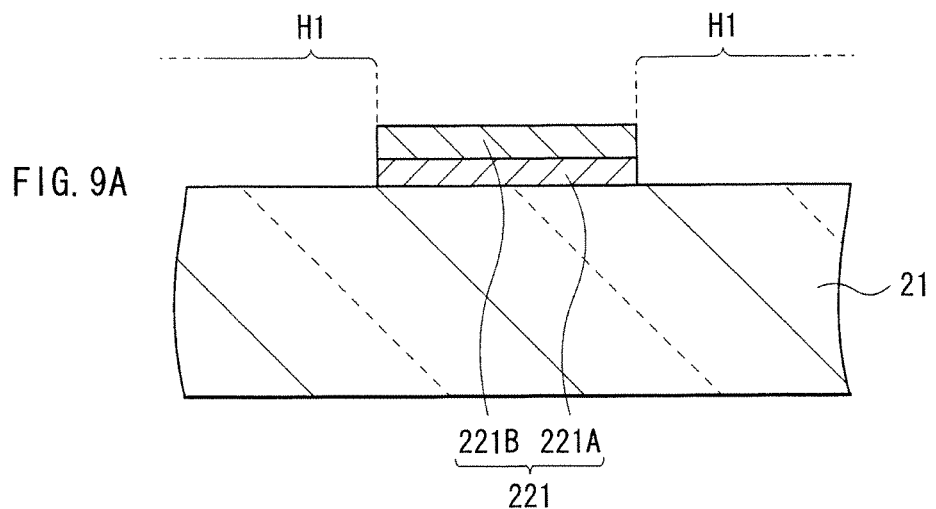
FIGS. 9A and 9B are a sectional view and a plan view illustrating a step following FIGS. 8A and 8B, respectively.
Figure 9B:
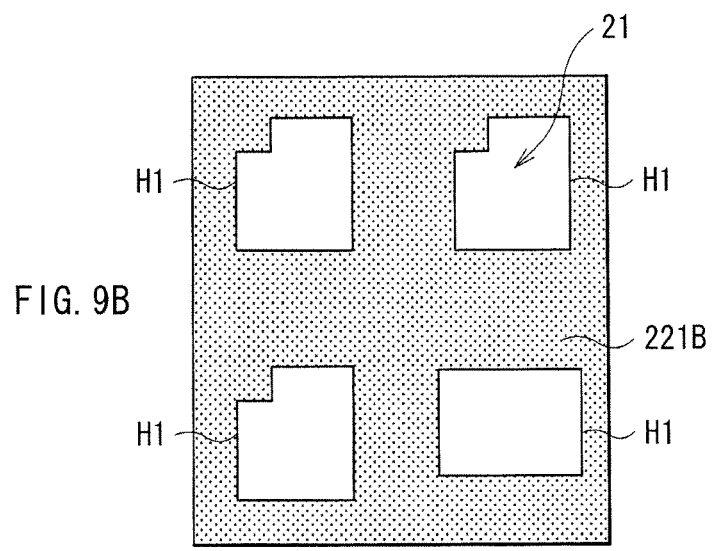

After that, as illustrated in FIGS. 9A and 9B, the laminate film 221 is patterned. More specifically, selective regions of the laminate film 221 are collectively removed by etching with use of, for example, the photolithography method to form a plurality of openings H1. At this time, for example, in the case where the three-layer laminate film of SiN/a-Si/Mo is formed as the inorganic light-shielding layer 221A, the inorganic light-shielding layer 221A and the low-resistance layer 221B may be collectively patterned by dry etching. Alternatively, in the case where the four-layer laminate film of $MoO_x$/Mo/$MoO_x$/Mo is formed, the inorganic light-shielding layer 221A and the low-resistance layer 221B may be collectively patterned by wet etching.

Figure 10A:
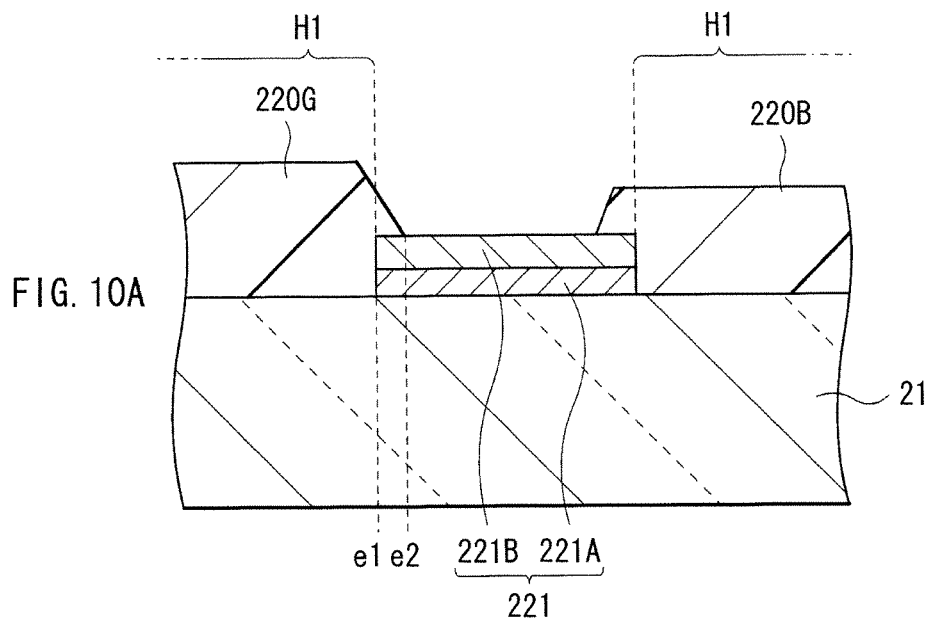
FIGS. 10A and 10B are a sectional view and a plan view illustrating a step following FIGS. 9A and 9B, respectively.
Figure 10B:
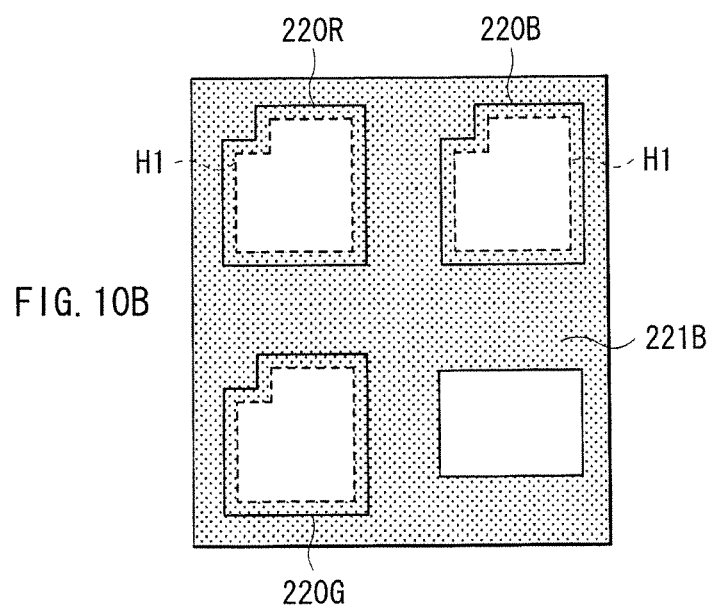

Next, as illustrated in FIGS. 10A and 10B, the red resin layer 220R, the green resin layer 220G, and the blue resin layer 220B are pattern-formed in respective openings H1 of the laminate film 221 on the second substrate 21.

Thus, in the embodiment, the inorganic light-shielding layer 221A as a black matrix and the low-resistance layer 21B as the auxiliary electrode of the upper electrode 19 are laminated to form the laminate film 221, and then the laminate film 221 is collectively patterned. Then, after the patterning step, the color filter layers each made of a resin material are formed. As will be described in detail later, the resin materials forming the color filter layers are easily eluted into an etchant used to pattern an inorganic film; therefore, when patterning is performed on a metal which eventually forms the auxiliary electrode after the forming of the color filter layers, the color filter layers may be damaged. In the embodiment, as described above, the black matrix is formed of the inorganic light-shielding layer 221A, and the low-resistance layer 221B is patterned before the forming of the color filter layers; therefore, elution of the color filter layers is preventable.

As described above, the color filter layers are formed after the patterning of the laminate film 221; therefore, the color filter layers (the red resin layer 220R, the green resin layer 220G, and the blue resin layer 220B) are thinned to overlap edges of the low-resistance layer 221B.

Figure 11A:
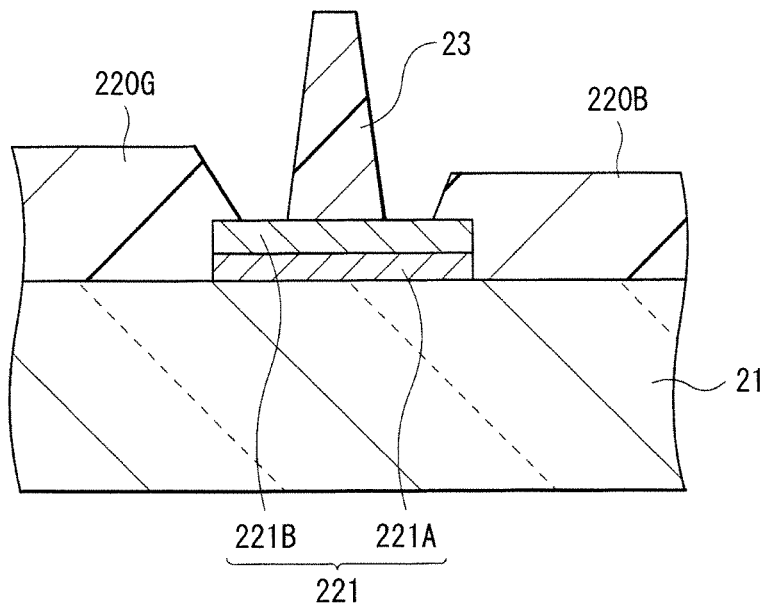
FIGS. 11A and 11B are a sectional view and a plan view illustrating a step following FIGS. 10A and 10B, respectively.
Figure 11B:
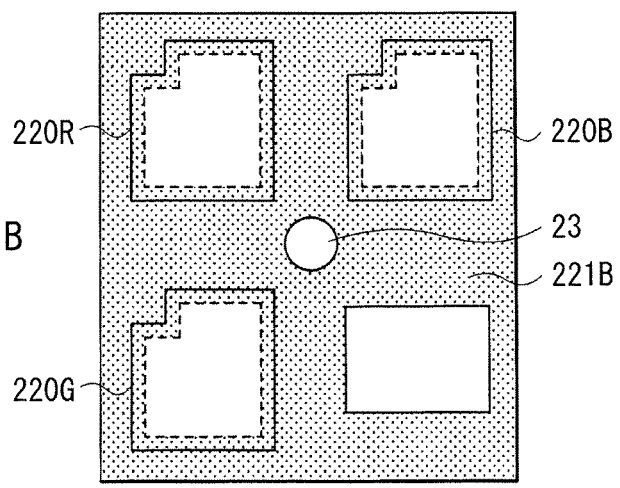

Next, as illustrated in FIGS. 11A and 11B, the pillars 23 are formed in selective regions on the low-resistance layer 221B. For example, a photosensitive acrylic resin used for a photo spacer or the like may be used for the pillars 23, and the pillars 23 are formed by exposure to light with use of a photomask. After that, the conductive film 24 made of the above-described material is formed on an entire surface of the substrate by, for example, the sputtering method to form the counter substrate 20.

(Bonding (Sealing) Step)

Next, the device substrate 10 and the counter substrate 20 which are fabricated by the above-described steps are bonded together with the sealing layer 30 in between. At this time, for example, a film formation technique called an ODF (One Drop Fill) method is preferably used. The ODF method is a technique in which a plurality of resin drops are applied, at equal intervals, to the device substrate 10 (or the counter substrate 20), and then both substrates 10 and 20 are pressure-bonded together under vacuum. After that, when the substrates are released to air, the resin drops are filled between the substrates 10 and 20 by pressure (atmospheric pressure) applied on the substrates 10 and 20. After the resin is filled in such a manner, the resin is cured.

More specifically, first, as illustrated in FIG. 12A, the device substrate 10 and the counter substrate 20 are placed between plates 280A and 280B in a vacuum chamber to face each other, and the resin layer 310a (the dam member) as the sealing layer 30 is applied to, for example, an outer region of the device substrate 10, and then the resin layer 310b, for example, a resin material is dropped onto a plurality of points at equal intervals in a region surrounded by the resin layer 310a. The resin layers 310a and 310b are in a liquid form or a gel form at this time before being cured, and the resin layer 310a is made of a material with higher viscosity, and the resin layer 310b is made of a material with lower viscosity.

Next, as illustrated in FIG. 12B, the device substrate 10 and the counter substrate 20 are mechanically pressure-bonded together with use of the plates 280A and 280B. The resin layer 310b is spread in the region surrounded by the resin layer 310a between the device substrate 10 and the counter substrate 20.

After that, as illustrated in FIG. 12C, when the device substrate 10 and the counter substrate 20 are taken out of the chamber to be exposed to air, the device substrate 10 and the counter substrate 20 are further pressurized by atmospheric pressure to allow a region between the device substrate 10 and the counter substrate 20 to be filled with the resin layers 310a and 310b. Finally, the sealing layer 30 is formed through curing the resin layers 310a and 310b. Thus, the organic EL display unit 1 illustrated in FIG. 1 is completed.

It is to be noted that a thermosetting resin or a photo-curable resin may be used for the resin layers 310a and 310b, and in the case where the photo-curable resin is used, a photo-curable resin cured by light with a wavelength allowed to pass through the color filter layers is used. Alternatively, a delayed photo-curable resin may be used, and in this case, the resin is irradiated with light in advance before pressure-bonding, and the resin is filled between the substrates as described above before the resin is completely cured, and then the resin is completely cured by irradiation with light again.

Figure 13A:
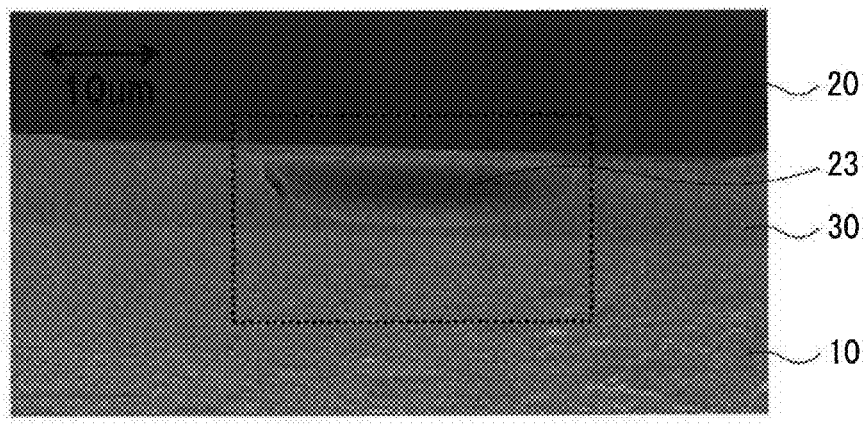
FIGS. 13A and 13B are SEM photographs illustrating a relationship between a filling amount of a sealing resin and contact of the sealing resin.
Figure 13B:
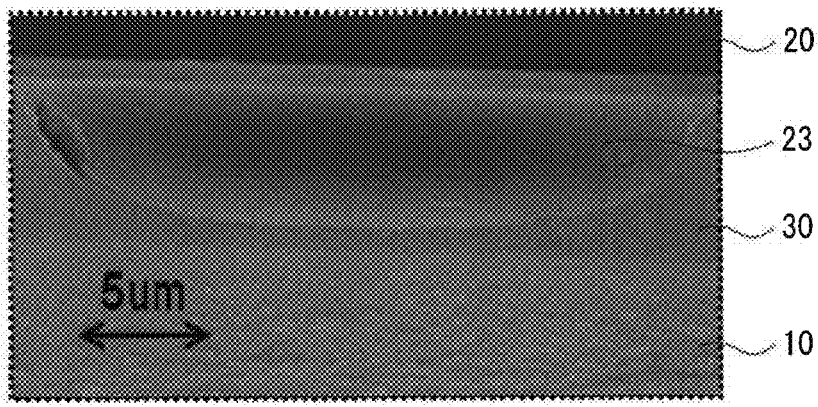
Figure 14A:
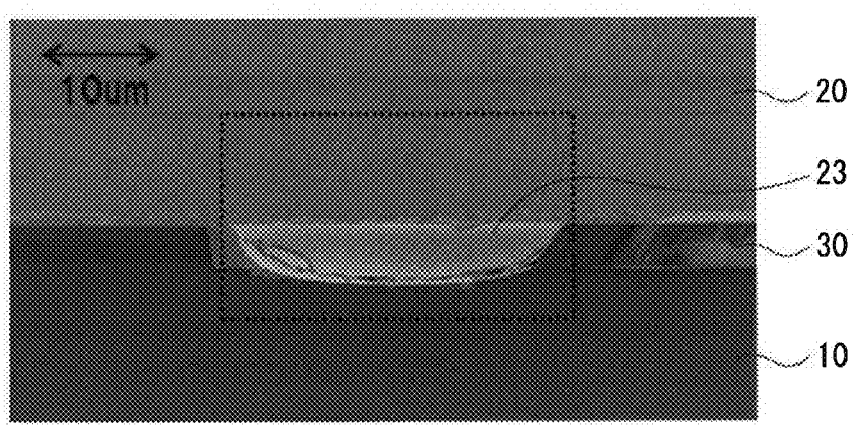
FIGS. 14A and 14B are SEM photographs illustrating a relationship between the filling amount of the sealing resin and contact of the sealing resin.
Figure 14B:
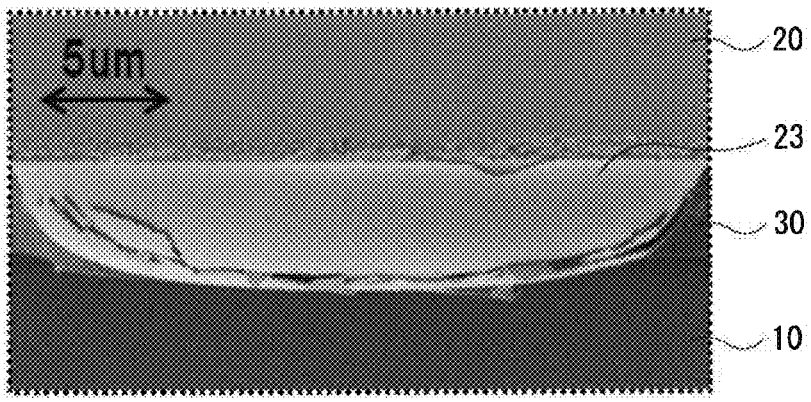

Moreover, in the embodiment, the sealing layer 30 does not have conductivity, and in this case, coating amounts (drop amounts) of the resin layers 310a and 310b are desirably approximately 120% or less with respect to a sealing volume (a necessary volume of the sealing layer 30 between the device substrate 10 and the counter substrate 20), and more desirably approximately 100% to 120% with respect to the sealing volume. The "sealing volume" corresponds to a volume corresponding to an effective pixel region of the region between the device substrate 10 and the counter substrate 20. For example, the sealing volume does not include a region light-shielded by a light-shielding pattern 311 which will be described later (a gap 310c as a resin buffer layer). It is experimentally found out that, when the amount of the sealing resin was too small (for example, smaller than approximately 90%), conduction between the substrates was ensured; however, a considerable gap was formed between the substrates, and the gap was observed as sealing unevenness. On the other hand, it is experimentally found out that, when the coating amount was too large (for example, larger than 120%), it was difficult to ensure conduction between the substrates. For example, when the coating amount was 120%, conduction between the substrates was ensured but was not sufficient, and when the coating amount was 135%, conduction was not ensured. On the other hand, when the coating amount was 105%, a visually observed gap was not formed, and conduction between the substrates was ensured. FIGS. 13A and 13B illustrate photographs around an interface between the substrates when the coating amount was larger than 120% (135%), and FIGS. 14A and 14B illustrate photographs around the interface between the substrates when the coating amount was within a range of 100% to 120% (105%). It can be seen from an example illustrated in FIGS. 13A and 13B that the pillars 23 are not in contact with the device substrate 10, and in an example illustrated in FIGS. 14A and 14B, the pillars 23 and the device substrate 10 are in contact with each other.

Figure 15A:
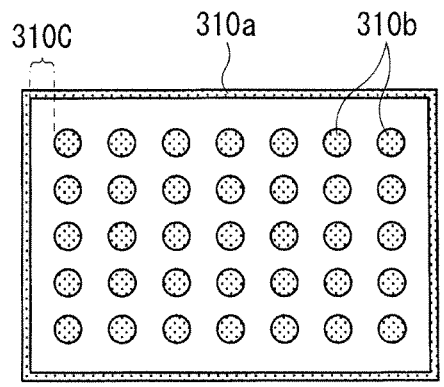
FIGS. 15A to 15D are schematic plan views illustrating configurations of an outer region of a sealing layer.
Figure 15B:
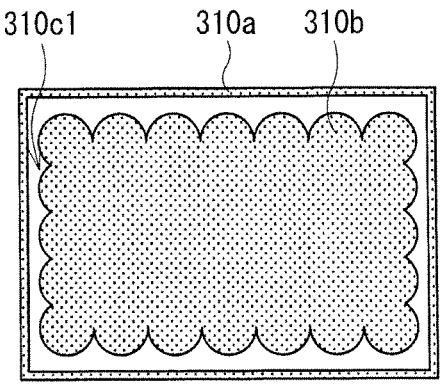
Figure 15C:
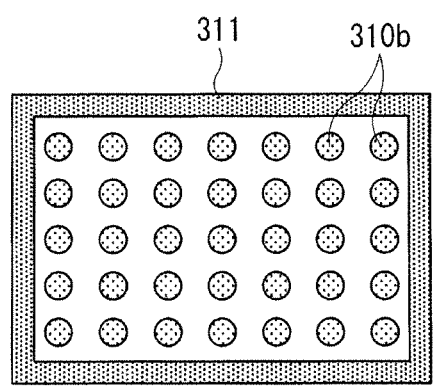
Figure 15D:
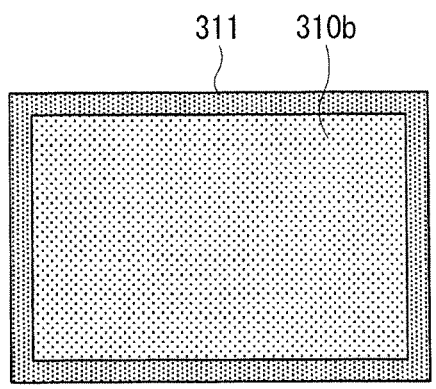

In the sealing layer 30, the gap 310c may be disposed as a buffer layer for the resin layers 310a and 310b in an outer region of the sealing layer 30 between the resin layer 310a and the resin layer 310b located at an outermost side. Even if a gap is formed in the outer region, unlike the pixel section, the gap does not affect viewability, thereby not causing an issue in particular. In the above-described ODF process, the resin is forced out by atmospheric pressure eventually, and a cell gap (the thickness of the sealing layer 30) is defined according to a height of an electrical connection member such as the pillar 23. At this time, a surplus resin is all forced out, and when the above-described gap 310c is disposed in the outer region in advance, the surplus resin is absorbed by the gap 310c, and the sealing layer 30 in the pixel section is easily controlled to have a desired thickness. Therefore, sealing unevenness is effectively reduced. Moreover, as illustrated in FIGS. 15C and 15D, a region where the gap 310c is disposed may be covered with the light-shielding pattern 311. Therefore, even if the entire gap 310c is not filled with the resin after bonding and a part (a gap 310c1) of the gap 310C remains, the light-shielding pattern 311 prevents the remaining gap 310c1 from being visually observed. It is to be noted that FIGS. 15A and 15C illustrate planar configurations before pressure-bonding (immediately after dropping the resin) and FIGS. 15B and 15D illustrate planar configurations after pressure-bonding by atmospheric pressure.

[Functions and Effects]

In the organic EL display unit 1, a predetermined drive current is injected into the organic layer 17 of each pixel (the organic EL device 10A) through the lower electrode 15 and the upper electrode 19 based on a scanning signal and the like supplied from a drive circuit (not illustrated). Therefore, light is emitted from the light-emitting layer of the organic layer 17 by recombination of holes and electrons. Light (white light) emitted from the organic layer 17 passes through the high-resistance layer 18, the upper electrode 19, the sealing layer 30, and the counter substrate 20 to be extracted as display light. When the light passes through the counter substrate 20, the light passes through the color filter layer of a corresponding color for each sub-pixel (the opening H1 in the sub-pixel of W1) to be extracted as color light of any of R, G, B, and W.

Thus, in the top emission type organic EL display unit 1, the color filter layers are formed in the counter substrate 20, and white light emitted from the organic layer 17 is extracted from the upper electrode 19, and passes through the color filter layers, thereby achieving color display. Therefore, as the upper electrode 19, it is necessary to use a transparent conductive film with high resistance; however, from an optical viewpoint, it is difficult for the upper electrode 19 to have a larger thickness. When the thickness of the upper electrode 19 is reduced, the resistance of the upper electrode 19 is increased accordingly, thereby causing a voltage drop. Moreover, as described above, variations in wiring resistance between respective regions of the pixel section become considerable with an increase in size or definition, thereby causing variations in in-plane luminance leading a voltage drop.

Comparative Examples

Therefore, for example, a configuration may be contemplated in which an auxiliary electrode made of a low-resistance metal is formed in the counter substrate. In this case, a black matrix made of a resin material (hereinafter referred to as "resin BM") and the color filter layers are formed in the counter substrate, and the auxiliary electrode is pattern-formed on the black matrix. The voltage drop is suppressed through electrically connecting the auxiliary electrode and the upper electrode to each other. However, in the case where the auxiliary electrode is formed on the resin BM, the patterning of the auxiliary electrode is performed by etching with use of the photolithography method; therefore, during the patterning, the resin is eluted by a strong etcher solvent. Accordingly, the reflectivity suppressing effect of the resin BM is impaired to cause a display defect, and it is also necessary to remove the resin eluted into the etcher solvent. Therefore, such a configuration is not suitable for upsizing and mass production. In addition, when the auxiliary electrode is protruded from the above-described resin BM, the high reflectivity of auxiliary electrode causes a display defect; therefore, it is necessary to form the auxiliary electrode slightly smaller than the resin BM to ensure a margin of alignment. Accordingly, a line width of the auxiliary electrode becomes extremely small especially with an increase in definition of pixels, and it is difficult to form the auxiliary electrode precisely, and it is difficult to obtain a sufficient resistance reduction effect.

On the other hand, in the embodiment, the low-resistance layer 221B electrically connected to the upper electrode 19 is formed in the counter substrate 20 to suppress the voltage drop in the upper electrode 19 and variations in in-plane luminance caused by the voltage drop. In particular, in the embodiment, the counter substrate 20 includes the laminate film 221 including the inorganic light-shielding layer 221A as a black matrix and the low-resistance layer 221B as the auxiliary electrode formed on the inorganic light-shielding layer 221A. In a manufacturing process, the low-resistance layer 221B and the inorganic light-shielding layer 221A are collectively concurrently patterned. Then, after the patterning step, the color filter layers made of the resin material (the red resin layer 220R, the green resin layer 220G, and the blue resin layer 220B) are formed. In the embodiment, as described above, the inorganic light-shielding layer 221A forms the black matrix, and the low-resistance layer 221B is patterned before forming the color filter layers; therefore, elution of the resin material is preventable. Thus, in the embodiment, in the counter substrate 20 including the color filter layers, the elution of the color filter layers is prevented, and the inorganic light-shielding layer 221A and the low-resistance layer 221B are pattern-formed precisely.

Figure 16:
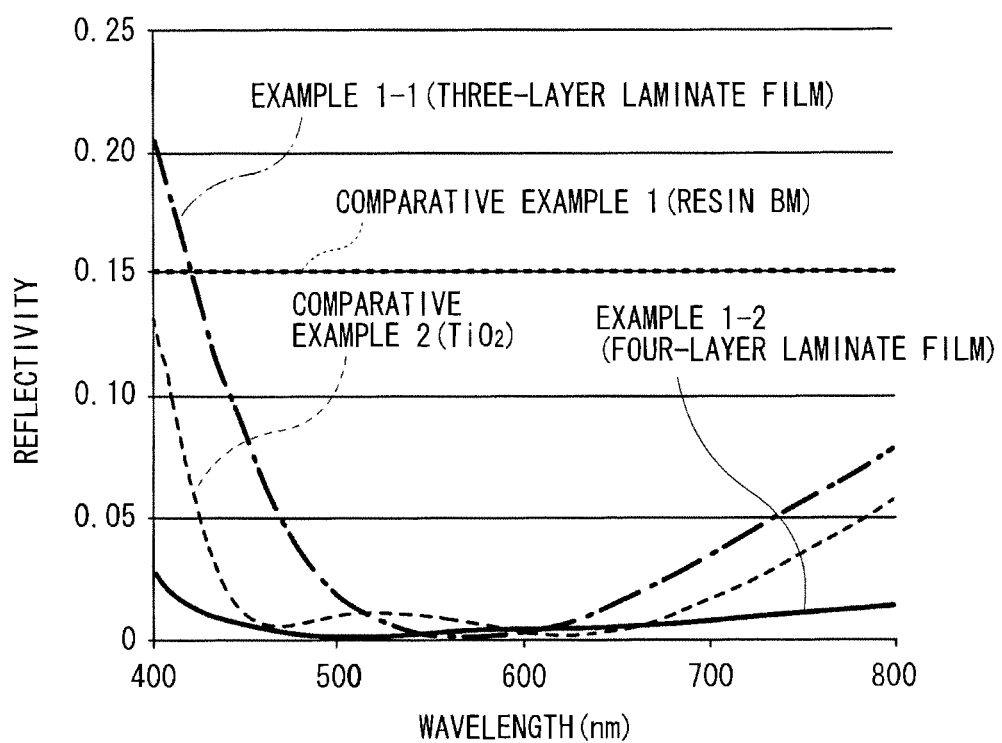
FIG. 16 is a plot illustrating reflectivity of light-shielding layers of examples and comparative examples.

Moreover, when the inorganic light-shielding layer 211A is configured of, for example, the above-described three-layer laminate film or the above-described four-layer laminate film, light-blocking performance equivalent to or higher than that of a typical resin BM is achievable. FIG. 16 illustrates reflectivity of the inorganic light-shielding layer 211A which was configured of a three-layer laminate film (SiN (65 nm)/a-Si (20 nm)/Mo (50 nm)) as Example 1-1. FIG. 16 further illustrates reflectivity of the inorganic light-shielding layer 211A which was configured of a four-layer laminate film (MoO$_x$ (45 nm)/Mo (10 nm)/MoO$_x$ (40 nm)/Mo (50 nm)) as Example 1-2. In FIG. 16, as comparative examples with respect to Examples 1-1 and 1-2, reflectivity of the resin BM as Comparative Example 1 and reflectivity in the case where a single-layer film of titanium oxide (TiO$_2$) was used as Comparative Example 2 are illustrated. It can be seen from FIG. 16 that the reflectivity in both Examples 1-1 and 1-2 is equal to or smaller than that of the resin BM, and that specifically Example 1-2 is low in reflectivity throughout a wide wavelength region and is optically superior in particular.

Moreover, in the embodiment, since the inorganic light-shielding layer 221A and the low-resistance layer 221B are collectively patterned, compared to the case where a metal as the auxiliary electrode is separately formed after forming the black matrix, it is not necessary to consider the margin of alignment. In other words, the low-resistance layer 221B is formed below the inorganic light-shielding layer 221A in the same pattern as that of the inorganic light-shielding layer 221A. Therefore, a maximum line width of the low-resistance layer 221B is ensured, and the voltage drop in the upper electrode 19 is effectively suppressed.

As described above, in the embodiment, the inorganic light-shielding layer 221A is included in the counter substrate 20, and the low-resistance layer 221B electrically connected to the upper electrode 19 is laminated on the inorganic light-shielding layer 221A. Therefore, even if the upper electrode 19 of the device substrate 10 has high resistance, a voltage drop caused by the high resistance is suppressed. Accordingly, variations in light emission luminance caused by an increase in size or definition are reduced to improve display quality.

Next, a modification (Modification 1) of the embodiment described above will be described below. It is to be noted that like components are denoted by like numerals as of the above-described embodiment and will not be further described.

(Modification 1)

Figure 17:
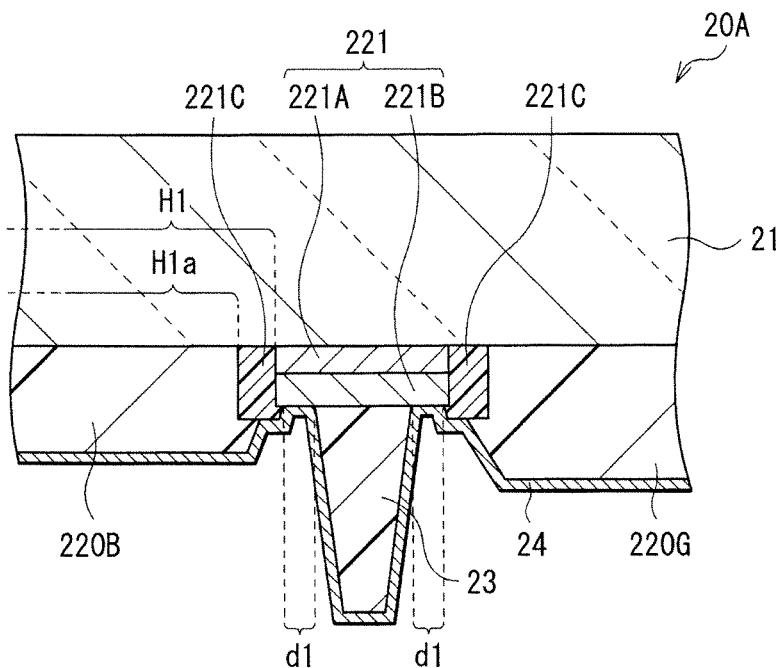
FIG. 17 is a sectional view illustrating a specific configuration of a counter substrate according to Modification 1.
Figure 18:
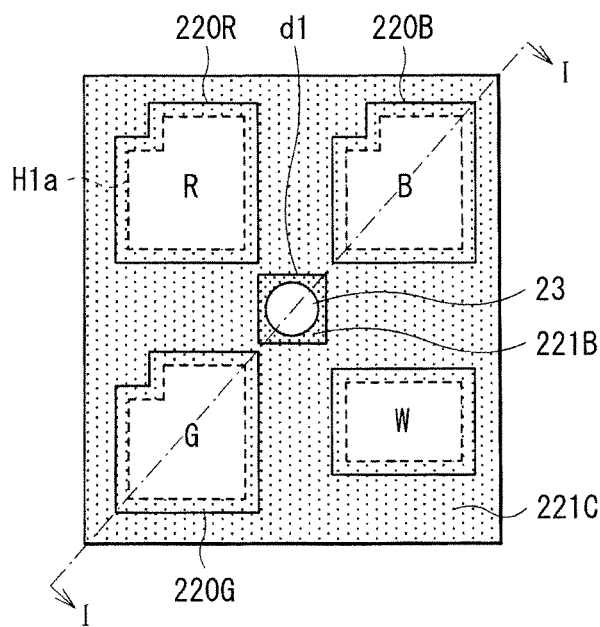
FIG. 18 is a schematic plan view illustrating a configuration of a main part of the counter substrate illustrated in FIG. 17.

FIGS. 17 and 18 illustrate a configuration of a counter substrate (a counter substrate 20A) according to Modification 1. FIG. 17 is an enlarged view of a configuration around the pillar 23 of the counter substrate 20A. FIG. 18 illustrates a configuration of the counter substrate 20A as seen from the sealing layer 30, though the conductive film 24 is not illustrated in FIG. 18. It is to be noted that FIG. 17 is a sectional view taken along a line I-I of FIG. 18.

As in the case of the counter substrate 20 in the first embodiment described above, the counter substrate 20A is bonded onto the device substrate 10 with the sealing layer 30 in between, and the color filter layers and the laminate film 221 as the black matrix and the auxiliary electrode are formed on the surface (the surface located closer to the device substrate 10) of the second substrate 21. Moreover, the pillars 23 are disposed in predetermined positions on the laminate film 221, and the conductive film 24 is formed to cover the color filter layers, the low-resistance layer 221B, and the pillars 23.

In this modification, a resin light-shielding layer 221c is further disposed to cover an inner wall of each of the openings H1 of the laminate film 221. The color filter layers each are formed to be filled in each opening H1a formed by the resin light-shielding layer 221c (the color filter layers each are formed to overlap an edge of each opening H1a).

The resin light-shielding layer 221c is formed to cover the inner wall of each of the openings H1 and to cover, for example, a top surface of the laminate film 221 (the low-resistance layer 221B) in a region not facing the openings H1. At least a part (d1) around a position where the pillar 23 is disposed of the low-resistance layer 221B is exposed from the resin light-shielding layer 221c, to electrically connect the upper electrode 19 and the low-resistance layer 221B to each other through the conductive film 24. The resin light-shielding layer 221c is made of for example, a photosensitive resin into which a black pigment or the like is mixed. Alternatively, a material having conductivity such as graphite may be used as the resin light-shielding layer 221c, thereby further improving conductivity in addition to the light blocking effect.

The above-described counter substrate 20A is fabricated by the following steps, for example. FIGS. 19A and 19B to FIGS. 21A and 21B illustrate steps of fabricating the counter substrate 20A, and FIGS. 19A to 21A are enlarged sectional views corresponding to the configuration in FIG. 17, and FIGS. 19B to 21B are schematic plan views corresponding to the configuration in FIG. 18. Moreover, a shaded part in each of FIGS. 19B to 21B corresponds to a region where the low-resistance layer 221B (the laminate film 221) and the resin light-shielding layer 221c are formed.

Figure 19A:
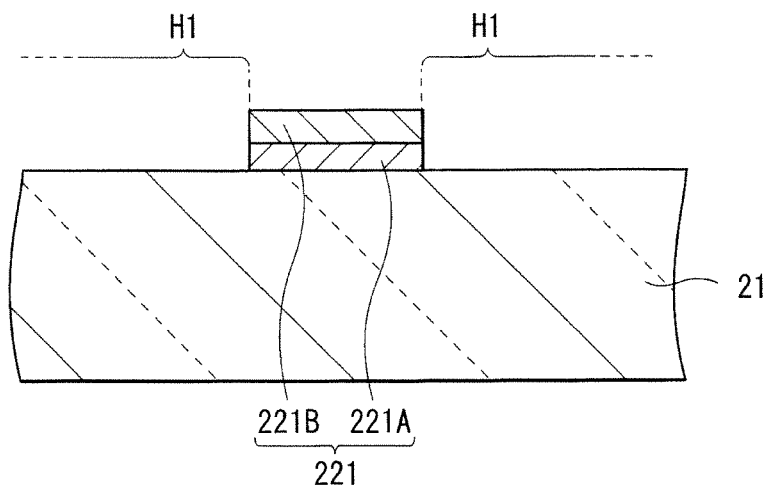
FIGS. 19A and 19B are a sectional view and a plan view, respectively, for describing a step of forming the counter substrate illustrated in FIG. 17.
Figure 19B:
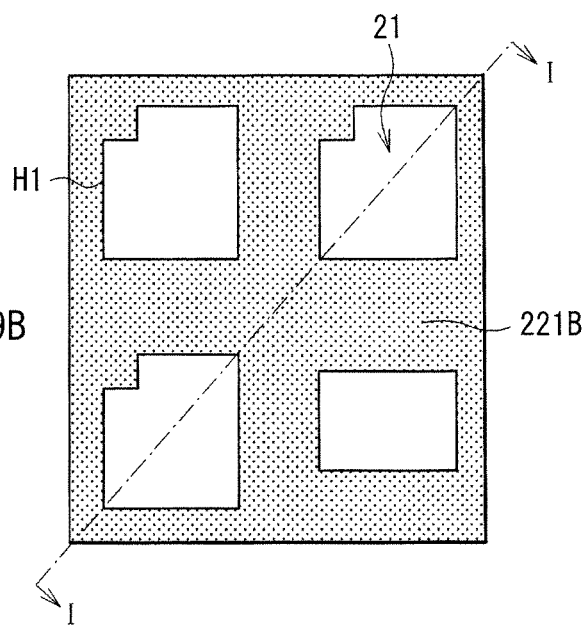

More specifically, first, as illustrated in FIGS. 19A and 19B, in a manner similar to that of the first embodiment, the inorganic light-shielding layer 221A and the low-resistance layer 221B are formed in order on the second substrate 21, and then are collectively patterned to form the laminate film 221 having the openings H1.

Figure 20A:
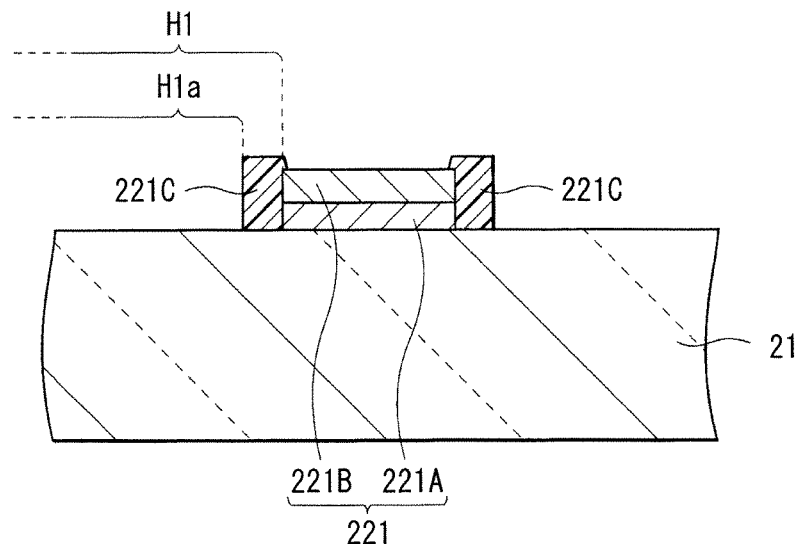
FIGS. 20A and 20B are a sectional view and a plan view illustrating a step following FIGS. 19A and 19B, respectively.
Figure 20B:
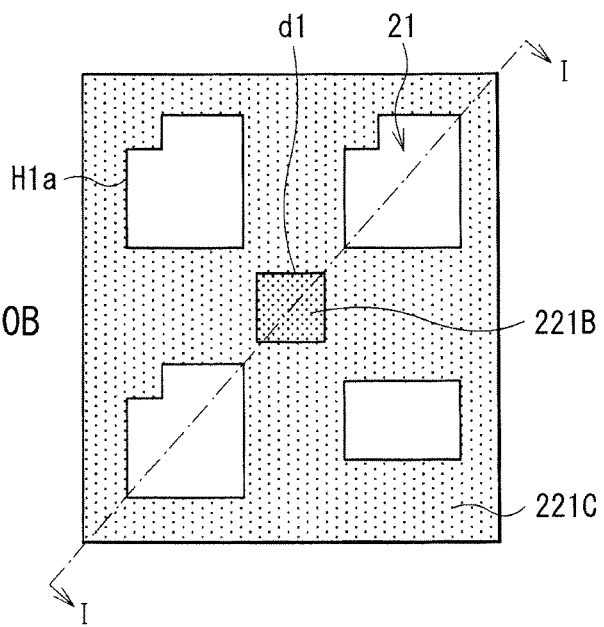

Next, as illustrated in FIGS. 20A and 20B, the resin light-shielding layer 221c is formed to cover the inner wall of each of the openings H1 of the laminate film 221 and a top surface of the laminate film 221. After that, a part d1 (a region where the pillar is to be formed) of the resin light-shielding layer 221c is opened by, for example, lithography to expose the low-resistance layer 221B.

Figure 21A:
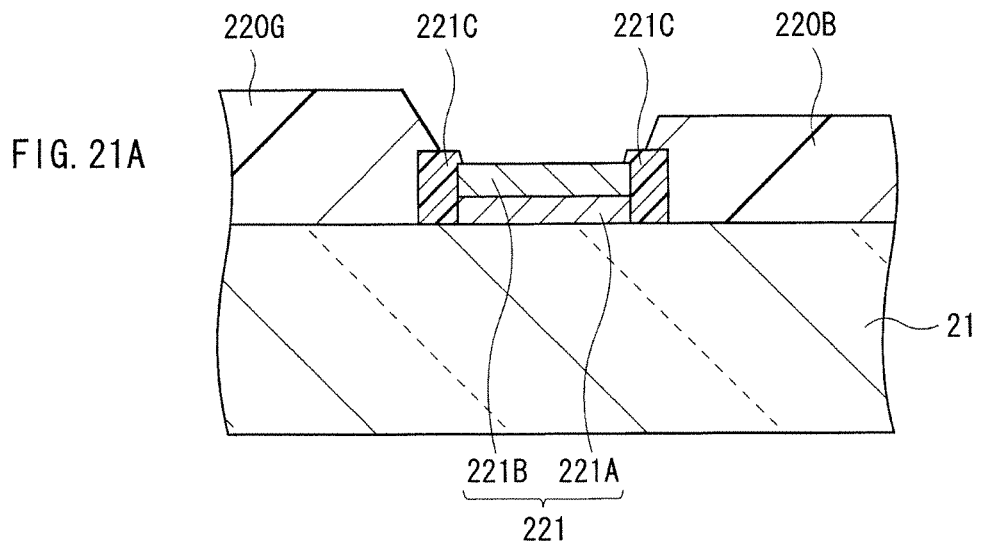
FIGS. 21A and 21B are a sectional view and a plan view illustrating a step following FIGS. 20A and 20B, respectively.
Figure 21B:
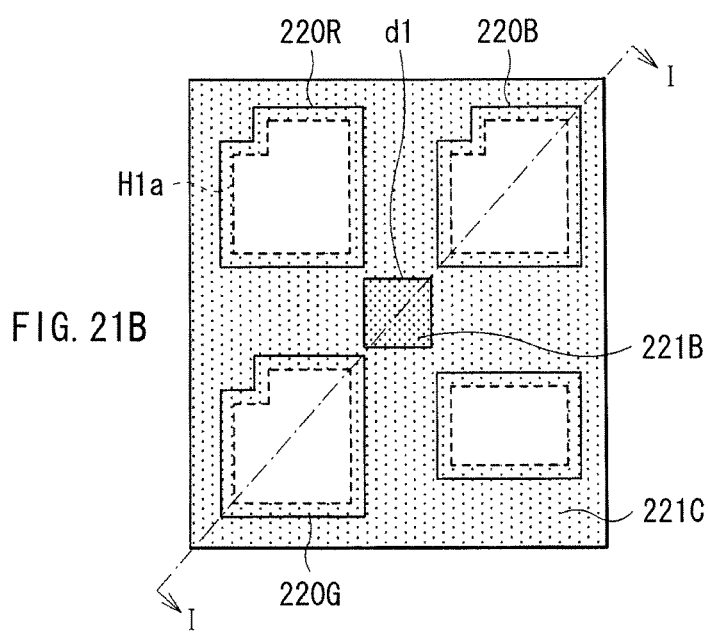

Next, as illustrated in FIGS. 21A and 21B, the red resin layer 220R, the green resin layer 220G, and the blue resin layer 22B are pattern-formed in respective openings H1a on the second substrate 21. Finally, in a manner similar to that of the first embodiment, the pillars 23 and the conductive film 24 are formed in selective regions on the low-resistance layer 221B to form the counter substrate 20A.

Thus, in this modification, the inorganic light-shielding layer 221A as the black matrix and the low-resistance layer 221B as the auxiliary electrode of the upper electrode 19 are laminated, and then the laminate film 221 is collectively patterned. Then, after the patterning step, the resin light-shielding layer 221c and the color filter layers each made of a resin material are formed. Therefore, also in this modification, as the low-resistance layer 221B is patterned before forming the color filter layers, elution of the color filter layers is preventable. Thus, effects similar to those in the first embodiment are obtainable.

Moreover, in the inorganic light-shielding layer 221A, a light blocking effect with respect to outside light or internally reflected light may become insufficient due to the wavelength and angle of incident light, or a deviation in film thickness from a design value, or the like, since the light interference effect is used. Therefore, as in this modification, the resin light-shielding layer 221c is disposed on a side surface section of the laminate film 221 to ensure the light blocking effect especially with respect to light incident from an oblique direction. Thus, internal reflection is suppressed to further improve display quality.

It is to be noted that, in the above-described modification, the resin light-shielding layer 221c is formed to cover the inner wall of each of the openings H1 of the laminate film 221; however, instead of the resin layer, a metal layer may be further laminated. For example, in FIG. 17, instead of the resin light-shielding layer 221c, a three-layer laminate film of $MoO_x$ (45 nm)/Mo (10 nm)/$MoO_x$ (40 nm) may be formed around the laminate film 221. In such a configuration, the light blocking effect and conductivity are reinforced, internal reflection is prevented, and conduction between the low-resistance layer 221B and the upper electrode 19 is easily ensured.

Second Embodiment

Figure 22:
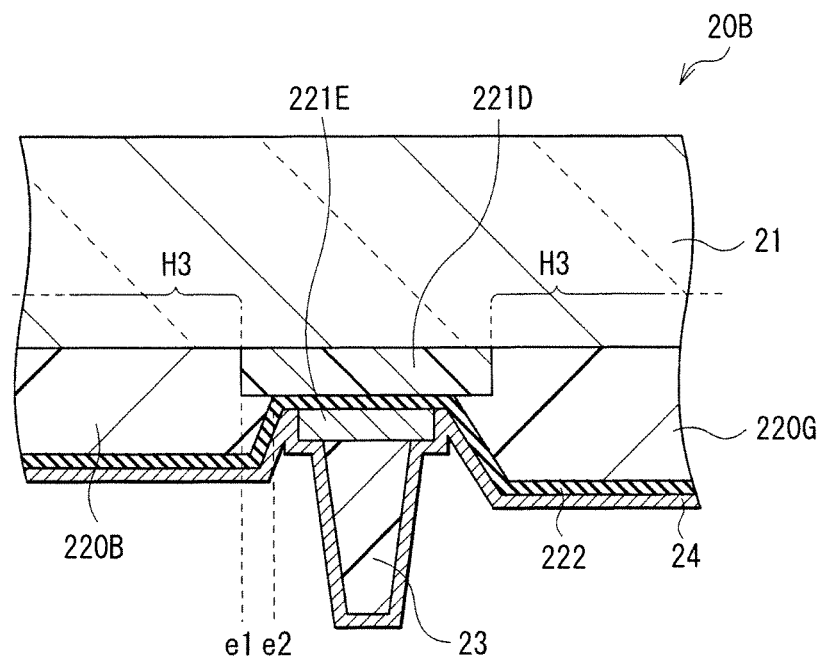
FIG. 22 is a sectional view illustrating a specific configuration of a counter substrate of an organic EL display unit according to a second embodiment of the disclosure.
Figure 23:
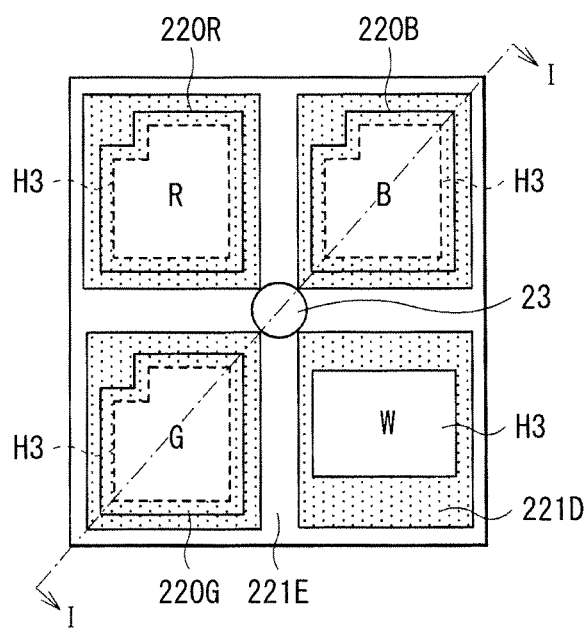
FIG. 23 is a schematic plan view illustrating a configuration of a main part of the counter substrate illustrated in FIG. 22.

FIGS. 22 and 23 illustrate a configuration of a counter substrate (a counter substrate 20B) according to a second embodiment of the disclosure. FIG. 22 is an enlarged view of a configuration around the pillar 23 of the counter substrate 20B. FIG. 23 illustrates a configuration of the counter substrate 20B as seen from the sealing layer 30, though the overcoat layer 222 and the conductive film 24 are not illustrated in FIG. 23. It is to be noted that FIG. 22 is a sectional view taken along a line I-I of FIG. 23.

As in the case of the counter substrate 20 in the first embodiment, the counter substrate 20B is bonded onto the device substrate 10 with the sealing layer 30 in between, and the color filter layers are formed on the surface (the surface located closer to the device substrate 10) of the second substrate 21. Moreover, in the counter substrate 20B, a low-resistance layer (a low-resistance layer 221E) as the auxiliary electrode of the upper electrode 19 is pattern-formed, and the pillars 23 are disposed on the low-resistance layer 221E. The conductive film 24 is formed to cover the color filter layers, the low-resistance layer 221E, and the pillars 23.

In the second embodiment, a resin light-shielding layer 221D is disposed as a black matrix. The color filter layers (the red resin layer 220R, the green resin layer 220G, and the blue resin layer 220B) each are formed in each of openings H3 of the resin light-shielding layer 221D. An overcoat layer 222 (a protective layer) is formed on the entire surface of the second substrate 21 to cover the resin light-shielding layer 221D and the color filter layers. The low-resistance layer 221E is formed in a selective region (a region superimposed on the resin light-shielding layer 221D) on the overcoat layer 222.

As in the case of the resin light-shielding layer 221c in Modification 1, the resin light-shielding layer 221D is made of for example, a photosensitive resin into which a pigment having the light blocking effect is mixed. The overcoat layer 222 has a function of protecting the color filter layers, and is made of, for example, an acrylic resin, ITO, or IZO. As in the case of the low-resistance layer 221B in the first embodiment, the low-resistance layer 221E is configured through laminating one or a plurality of inorganic films, and a material similar to that of the low-resistance layer 221B may be used. Moreover, a planar shape of the low-resistance layer 221E has a lattice pattern along the shape of the resin light-shielding layer 221D.

The above-described counter substrate 20B is fabricated by the following steps, for example. FIGS. 24A and 24B to FIGS. 26A and 26B illustrate steps of fabricating the counter substrate 20B, and FIGS. 24A to 26A are enlarged sectional views corresponding to the configuration in FIG. 22, and FIGS. 24B to 26B are schematic plan views corresponding to the configuration in FIG. 23. Moreover, a shaded part in each of FIGS. 24B to 26B corresponds to a region where the resin light-shielding layer 221D is formed.

Figure 24A:
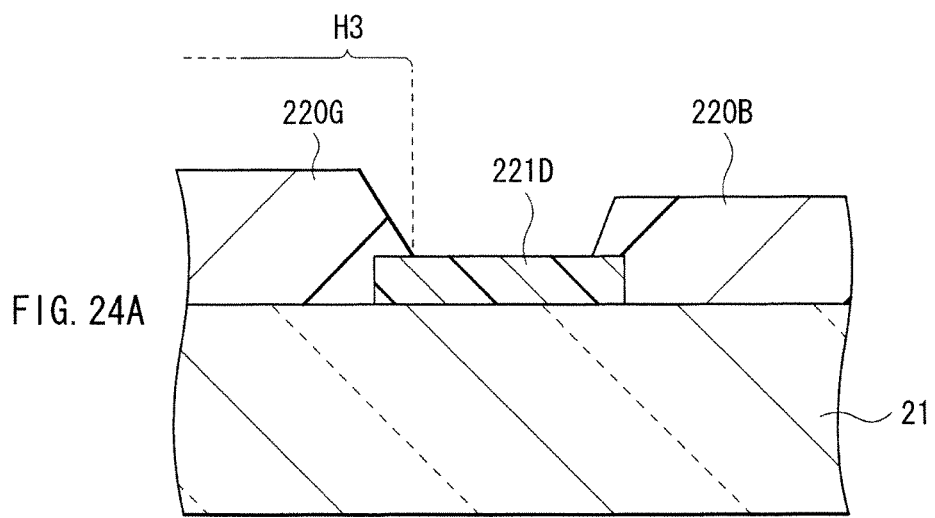
FIGS. 24A and 24B are a sectional view and a plan view, respectively, for describing a step of forming the counter substrate illustrated in FIG. 22.
Figure 24B:
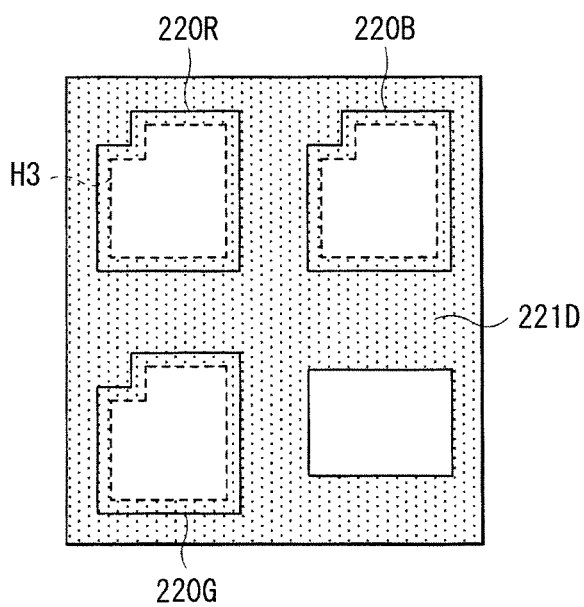
Figure 25A:
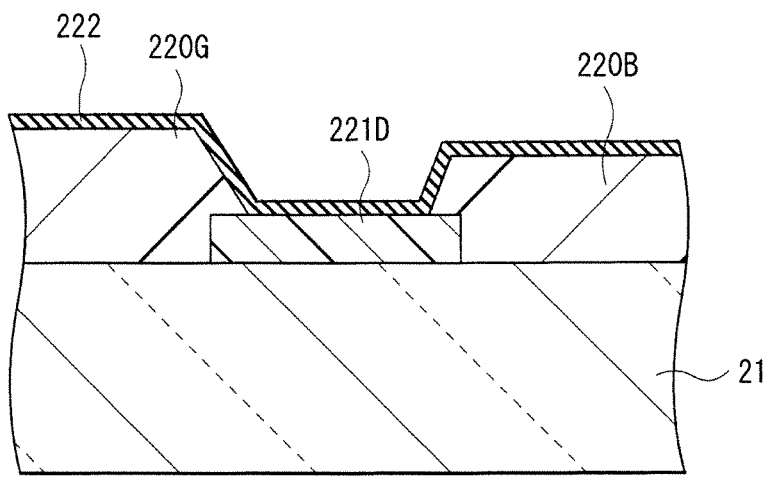
FIGS. 25A and 25B are a sectional view and a plan view illustrating a step following FIGS. 24A and 24B, respectively.
Figure 25B:
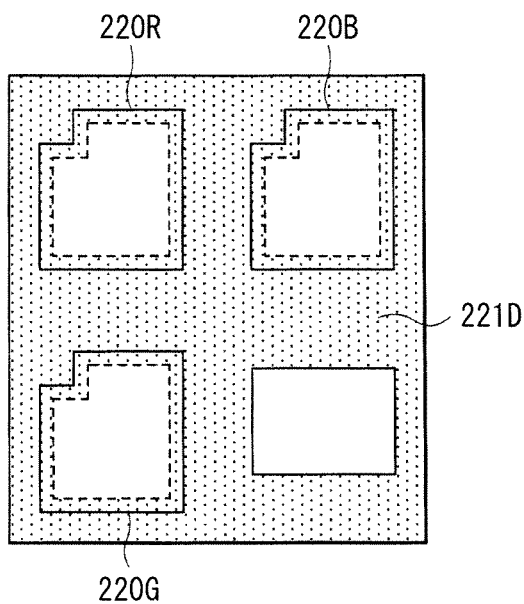

More specifically, as illustrated in FIGS. 24A and 24B, the resin light-shielding layer 221D and the color filter layers are pattern-formed on the second substrate 21. Next, as illustrated in FIGS. 25A and 25B, the overcoat layer 222 is formed by, for example, a slit coater method or the sputtering method to cover the light-shielding layer 221D and the color filter layers.

Figure 26A:
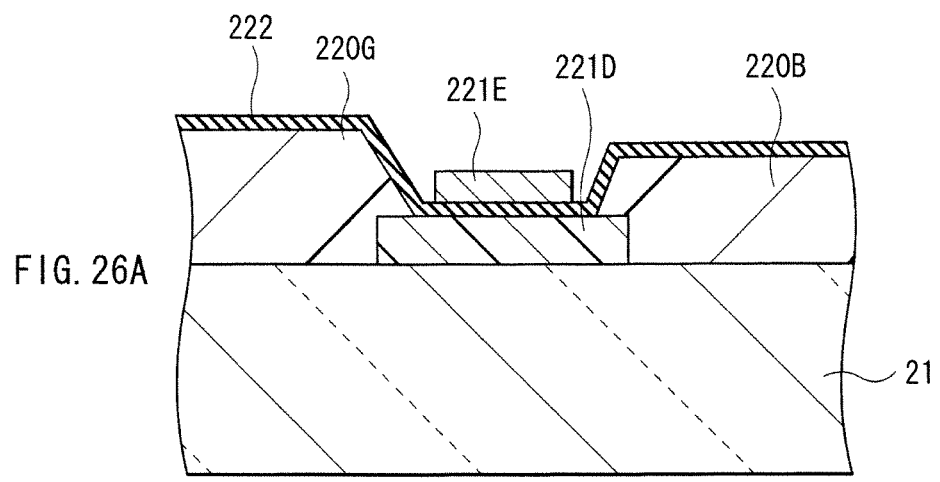
FIGS. 26A and 26B are a sectional view and a plan view illustrating a step following FIGS. 25A and 25B, respectively.
Figure 26B:
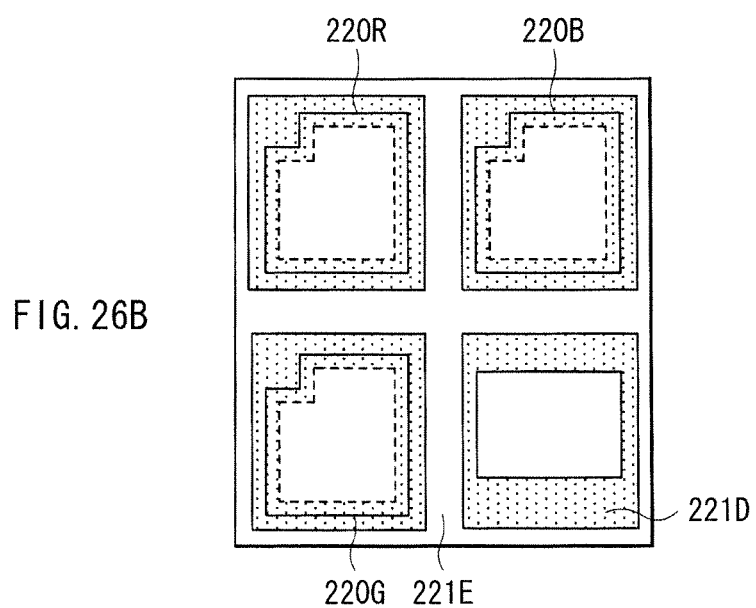

Next, as illustrated in FIGS. 26A and 26B, a film of the above-described low-resistance material is formed on the overcoat layer 222 by, for example, the sputtering method, and then the film is patterned by etching with use of, for example, the photolithography method to form the low-resistance layer 221E. Finally, the pillars 23 are formed in selective regions on the low-resistance layer 221E in a manner similar to that in the first embodiment, and the conductive film 24 is further formed, thereby fabricating the counter substrate 20B.

Thus, in the second embodiment, the resin light-shielding layer 221D as the black matrix and the color filter layers are formed, and then the overcoat layer 222 is formed before forming the low-resistance layer 221E. Therefore, the color filter layers and the resin light-shielding layer 221D are protected from an etchant used in patterning of the low-resistance layer 221E, and damage on the color filter layers and the resin light-shielding layer 221D is suppressed. Therefore, also in the second embodiment, elution of the color filter layers in the step of forming the low-resistance layer 221E is preventable. Thus, effects similar to those in the first embodiment are obtainable.

Moreover, the color filter layers and the resin light-shielding layer 221D each made of a resin material are possible sources of water or gas, and when water or the like reaches the organic layer 17, the organic layer 17 is degraded. When the overcoat layer 222 is included as in the case of the second embodiment, the entry of water or the like from the color filter layers or the resin light-shielding layer 221D to the organic layer 17 is blocked, and reliability of the organic EL display unit is improved.

Next, modifications (Modifications 2 to 5) of the first and second embodiments will be described below. Modifications 2 and 3 relate to other configurations of the pillar, and Modifications 4 and 5 relate to other techniques of electrically connecting the upper electrode and the low-resistance layer to each other. In Modifications 2 and 3, a configuration using the laminate film 221 in the first embodiment is described as an example; however, Modifications 2 and 3 are applicable to the second embodiment in a similar manner. It is to be noted that like components are denoted by like numerals as of the first embodiment and will not be further described.

(Modification 2)

Figure 27:
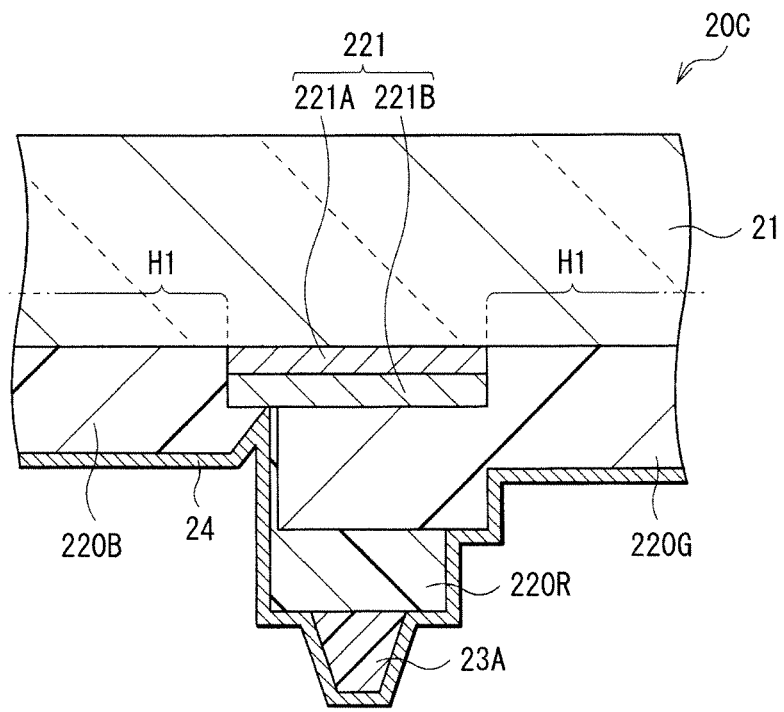
FIG. 27 is a sectional view illustrating a specific configuration of a counter substrate according to Modification 2.
Figure 28:
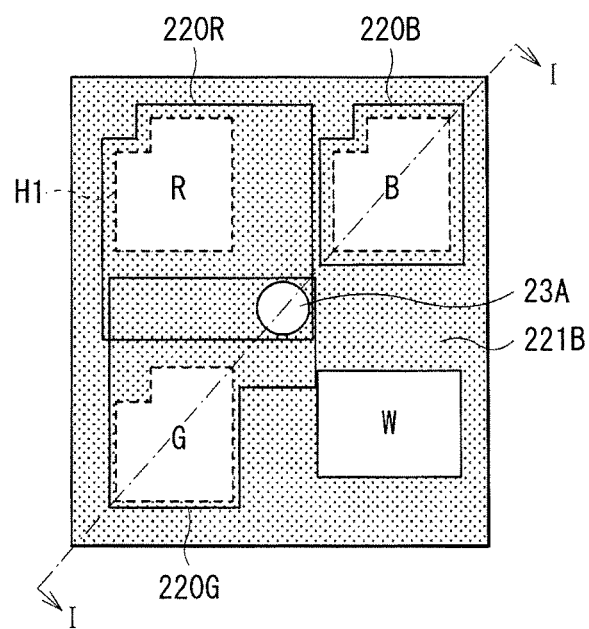
FIG. 28 is a schematic plan view illustrating a configuration of a main part of the counter substrate illustrated in FIG. 27.

FIGS. 27 and 28 illustrates a configuration of a counter substrate (a counter substrate 20C) according to Modification 2. FIG. 27 is an enlarged view of a configuration around a pillar (a pillar 23A) of the counter substrate 20C. FIG. 28 illustrates a configuration of the counter substrate 20C as seen from the sealing layer 30, though the conductive film 24 is not illustrated in FIG. 28. It is to be noted that FIG. 27 is a sectional view taken along a line I-I of FIG. 28.

As in the case of the counter electrode 20 in the first embodiment, the counter substrate 20C is bonded onto the device substrate 10 with the sealing layer 30 in between. Moreover, the counter substrate 20C is configured through forming the color filter layers (the red resin layer 220R, the green resin layer 220G, and the blue resin layer 220B) and the laminate film 221 as the black matrix and the auxiliary electrode on the surface (the surface located closer to the device substrate 10) of the second substrate 21. The pillars 23A are disposed in predetermined positions on the laminate film 221, and the conductive film 24 is formed to cover the color filter layers, the low-resistance layer 221B, and the pillars 23A.

In this modification, one or two or more of the color filter layers are laminated on not only a region facing each of the openings H1 but also a region facing each of the pillars 23A on the laminate film 221. In other words, the pillars 23A are disposed on the laminate film 221 with the color filter layers in between. In this case, the blue resin layer 220B and the red resin layer 220R are formed to extend to a region facing each of the pillars 23A, and the blue resin layer 220B and the red resin layer 220R are laminated between the laminate film 221 and the pillar 23A. As in the case of the pillars 23 in the first embodiment, the pillars 23A are made of a conductive material or an insulating material, for example, a photosensitive resin used for a photo spacer or the like.

In this manner, a base (corresponding to a filter laminate section in one embodiment of the present disclosure) of each of the pillars 23A may be formed through forming the color filter layers to extend to the region facing each of the pillars 23A on the laminate film 221. This formation of the base is effective especially when the pillars 23A are not allowed to have a sufficient height. A total thickness of the color filter layers formed between the pillar 23A and the laminate film 221 and the height of the pillar 23A corresponds to a cell gap of the entire unit. For example, in the case where a material used for an existing photo spacer or the like is used, the height of the pillar 23A is, for example, approximately 3 μm to 10 μm, and in some cases, it is difficult to ensure a desired cell gap, since the pillar 23A is projected from the color filter layers. In such a case, a desired cell gap is ensured through laminating the color filter layers with a thickness of, for example, approximately 1 μm to 4 μm to raise the position of the pillar 23A. It is to be noted that the color filter layers may be formed to extend (be continued) from the opening H1 to the region facing the pillar 23A, or may be separately formed around the opening H1 and around the pillar 23A (the color filter layers may be locally laminated only in the region facing the pillar 23A and its peripheral region).

(Modification 3)

Figure 29:
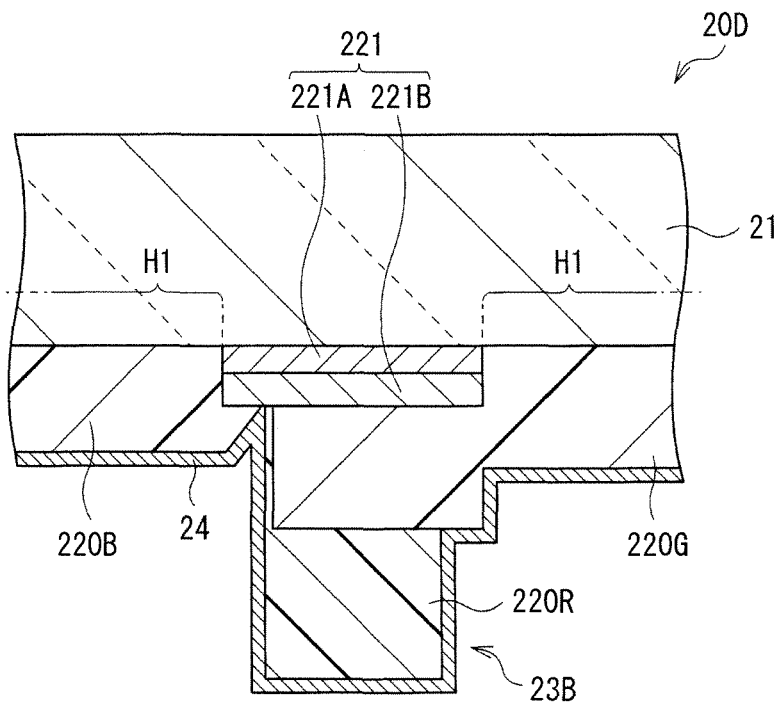
FIG. 29 is a sectional view illustrating a specific configuration of a counter substrate according to Modification 3.
Figure 30:
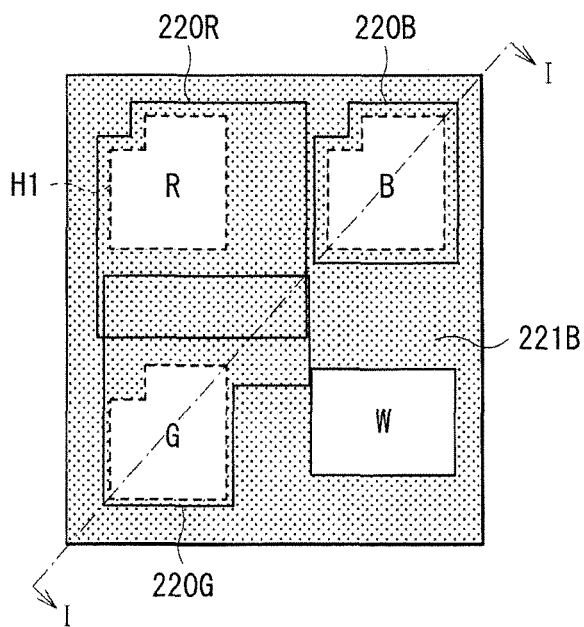
FIG. 30 is a schematic plan view illustrating a configuration of a main part of the counter substrate illustrated in FIG. 29.

FIGS. 29 and 30 illustrate a configuration of a counter substrate (a counter substrate 20D) according to Modification 3. FIG. 29 is an enlarged view of a configuration around a pillar (a pillar 23B) of the counter substrate 20D. FIG. 30 illustrates a configuration of the counter substrate 20D as seen from the sealing layer 30, though the conductive film 24 is not illustrated in FIG. 30. It is to be noted that FIG. 29 is a sectional view taken along a line I-I of FIG. 30.

In Modification 2, the color filter layers are laminated as the base of the pillar 23A; however, as in the case of this modification, the color filter layers themselves may be used as a pillar (the pillar 23B). For example, the green resin layer 220G and the red resin layer 220R may be formed to extend to a predetermined region on the laminate film 221, or the color filter layers may be locally laminated, thereby forming the pillar 23 with a desired height. The color filter layers may be laminated in local regions on the laminate film 221 to form the pillars 23B, and as in the case of the first embodiment, when the conductive film 24 is formed on the entire surface of the substrate after forming the pillars 23B, electrical connection to the upper electrode 19 is ensured at a point corresponding to the pillar 23B.

(Modification 4)

Figure 31:
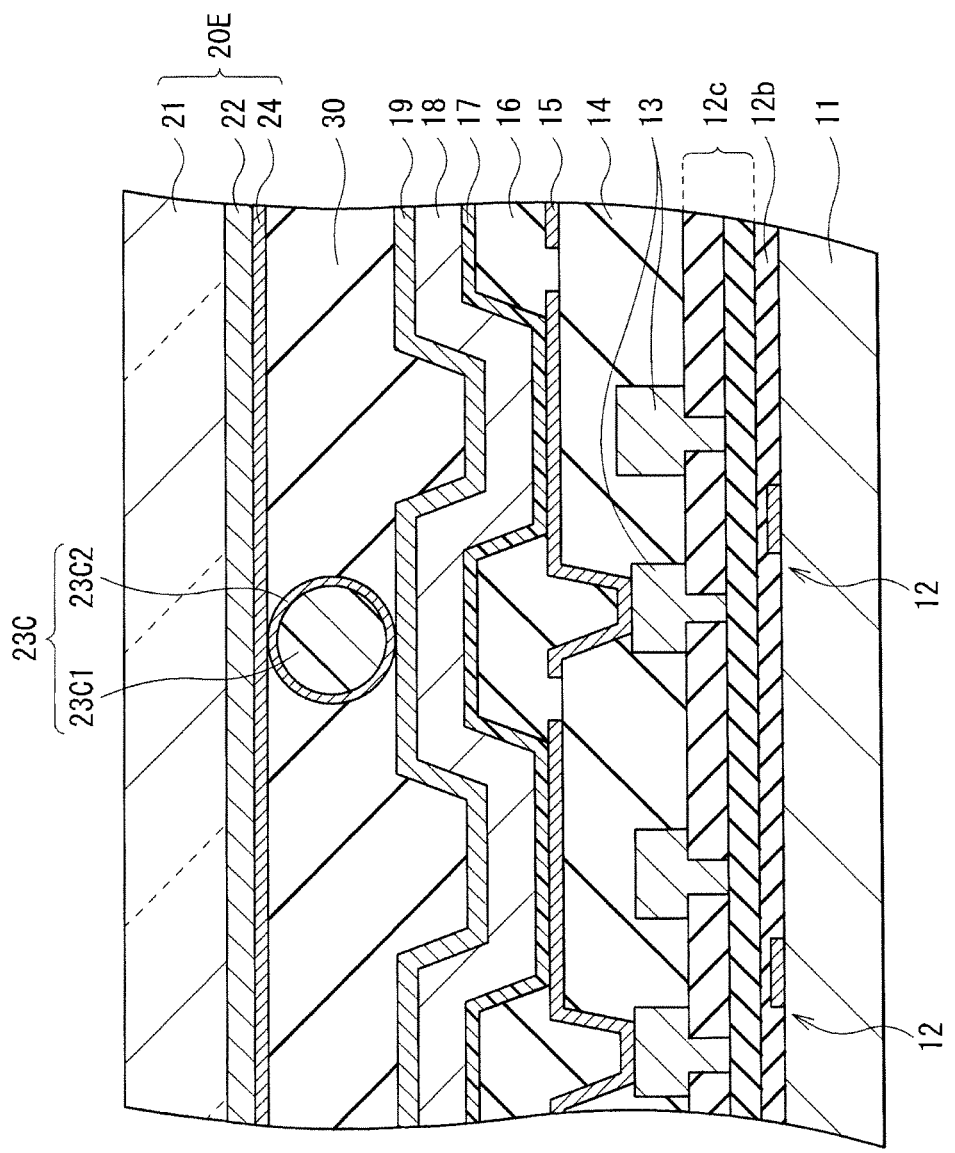
FIG. 31 is a sectional view illustrating a configuration of an organic EL display unit according to Modification 4.

FIG. 31 illustrates a sectional configuration of an organic EL display unit according to Modification 4. In the first embodiment and the like, the upper electrode 19 and the low-resistance layer 221B are electrically connected to each other with use of the pillars 23 (more specifically, the pillars 23 and the conductive film 24); however, alternative technique may be used as an electrical connection technique.

Figure 32:
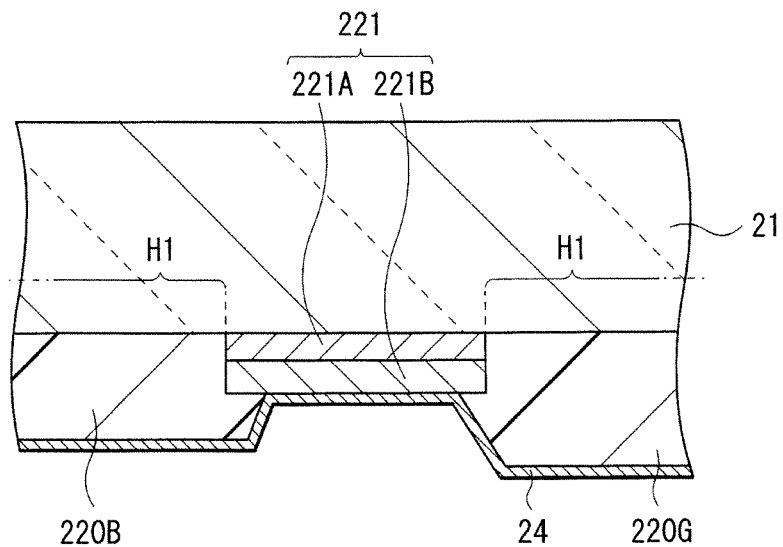
FIG. 32 is a sectional view illustrating a specific configuration of a counter substrate illustrated in FIG. 31.
Figure 33:
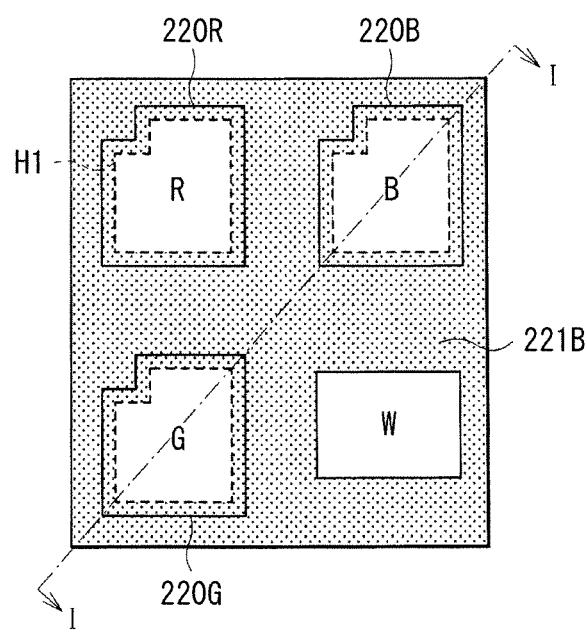
FIG. 33 is a schematic plan view illustrating a configuration of a main part of the counter substrate illustrated in FIG. 31.

For example, as in the case of this modification, a technique of disposing conductive balls 23C between the device substrate 10 and the counter substrate 20E to achieve contact may be used. In this case, the above-described pillars 23 are not disposed in the counter substrate 20E, and the conductive film 24 covers an entire surface of the CF/BM layer 22. FIG. 32 is an enlarged view of a part of the counter substrate 20E. FIG. 33 illustrates a configuration of the counter substrate 20E as seen from the sealing layer 30, though the conductive film 24 is not illustrated in FIG. 33. It is to be noted that FIG. 32 is a sectional view taken along a line I-I of FIG. 33. Thus, in the counter substrate 20E, the color filter layers are formed in respective openings H1 of the laminate film 221 on the second substrate 21, and the conductive film 24 is formed to cover, for example, the surfaces of the color filter layers and the low-resistance layer 221B.

The conductive balls 23C function as spacers between the device substrate 10 and the counter substrate 20E, and their particle diameter (for example, a diameter of 3 μm to 20 μm) defines a cell gap. It is not necessary for the conductive balls 23C to be disposed directly below the low-resistance layer 221B in particular, and the conductive balls 23C are disposed through being scattered on the device substrate 10 or the counter substrate 20 at the time of bonding the substrates. Examples of such conductive balls include balls $23c1$ made of an acrylic resin coated with a conductive film $23c2$. As the conductive film $23c2$, for example, a metal such as gold, titanium, or silver or a transparent conductive film of ITO or IZO may be used. Even if the conductive balls 23C are not disposed directly below the laminate film 221, by use of the transparent conductive film, viewability is less likely to be affected.

(Modification 5)

Figure 34:
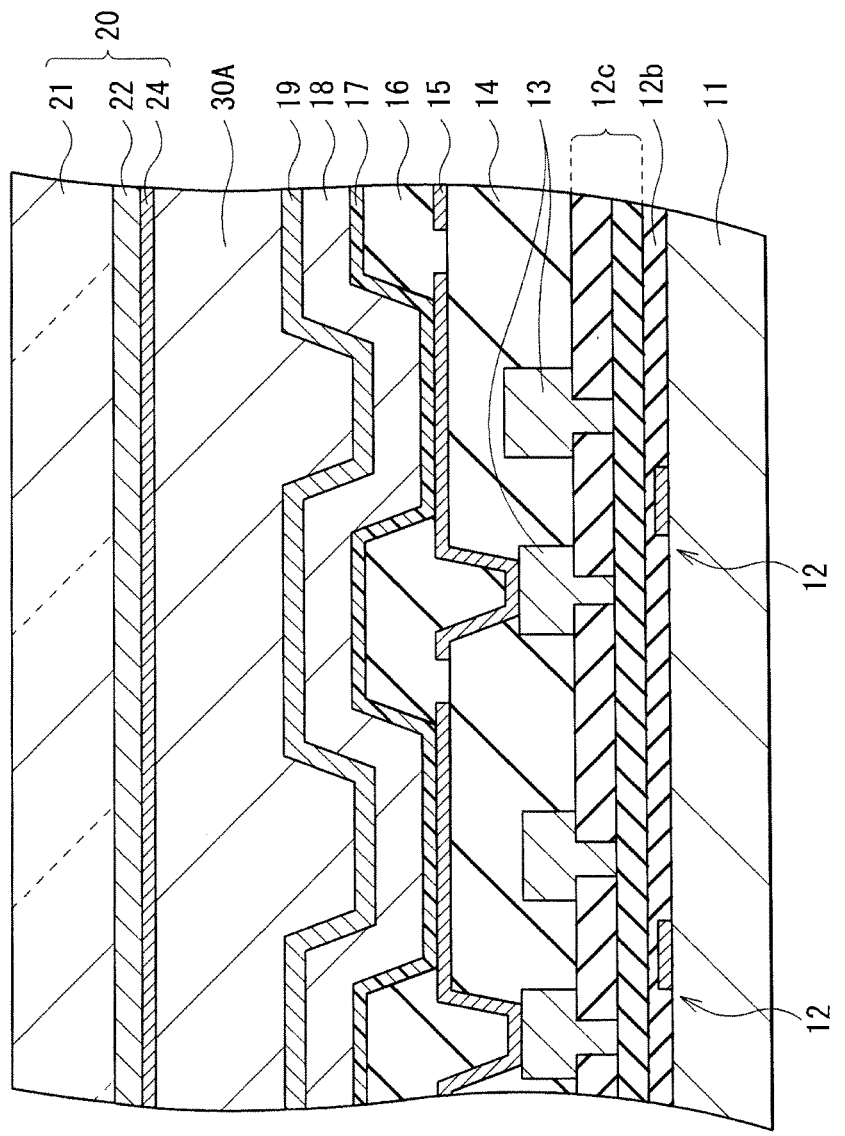
FIG. 34 is a sectional view illustrating a configuration of an organic EL display unit according to Modification 5.

FIG. 34 illustrates a sectional configuration of an organic EL display unit according to Modification 5. As another technique of electrically connecting the upper electrode 19 and the low-resistance layer 221B to each other, as in the case of this modification, a technique of bonding the device substrate 10 and the counter substrate 20E together with a sealing layer having conductivity (a sealing layer 30A) in between may be used.

The sealing layer 30A is made of a resin having conductivity (for example, an acrylic resin) into which a conductor material is mixed. As the conductor material, a metal nano material, nanosized carbon, a conductive polymer, and the like may be used. The electrical resistivity of the sealing layer 30A is not specifically limited; however, when the electrical resistivity is, for example, within a range of approximately $1 \times 10^6$ Ω·m to $1 \times 10^8$ Ω·m both inclusive, the sealing layer 30A also has a function as the high-resistance layer 18. Moreover, in the case where a sufficiently low resistance value is ensured in the sealing layer 30A, a configuration not including the upper electrode 19 is achievable. In other words, in the case where a conductive solid resin is used, the high-resistance layer 18 and the upper electrode 19 may not be included depending on the resistance value of the conductive solid resin, and a process without steps of forming them is possible.

Thus, when the sealing layer 30A using the conductive resin is disposed between the device substrate 10 and the counter substrate 20, electrical connection between the upper electrode 19 and the low-resistance layer 221B is ensured by a simple process without separately including a member for connection such as the above-described pillars or the above-described conductive balls.

[Entire Configuration of Display Unit and Pixel Circuit Configuration]

Figure 35:
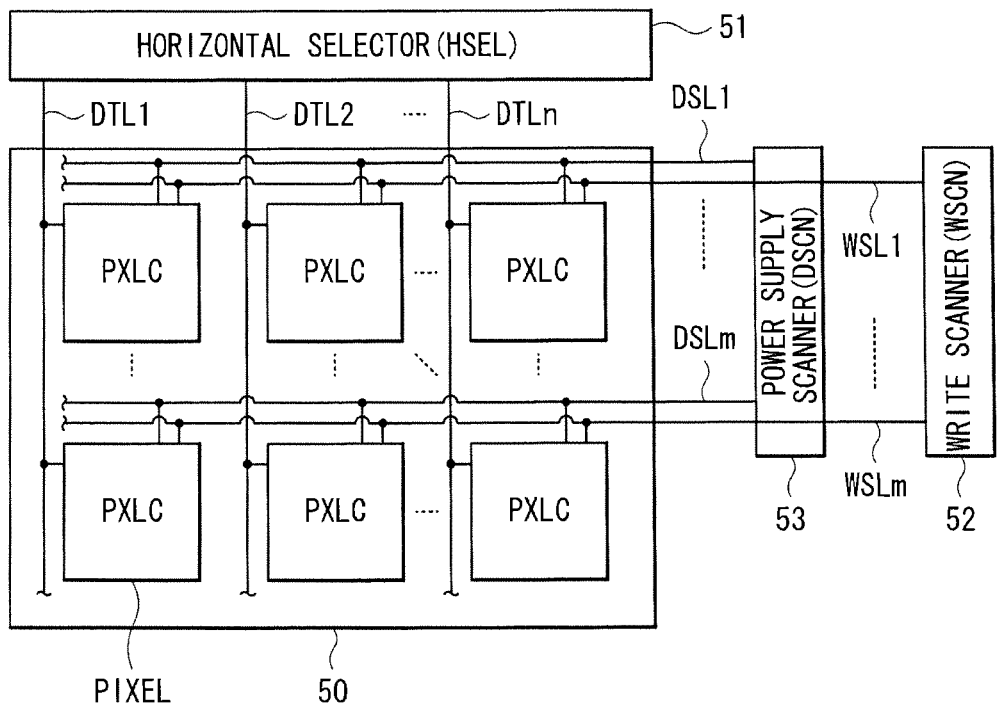
FIG. 35 is a diagram illustrating an entire configuration including a peripheral circuit of the display unit according to any of the embodiments.

An entire configuration of the organic EL display unit (hereinafter simply referred to as "display unit") and a pixel circuit configuration according to the first embodiment or the like will be described below. FIG. 35 illustrates the entire configuration including peripheral circuits of the display unit used as the organic EL display unit. As illustrated in FIG. 35, for example, a display region 50 in which a plurality of pixels PXLC each including the organic EL device are arranged in a matrix form is formed on a substrate 11, and a horizontal selector (HSEL) 51 as a signal-line drive circuit, a write scanner (WSCN) 52 as a scanning-line drive circuit, and a power supply scanner (DSCN) 53 as a power-supply line drive circuit are disposed around the display region 50.

In the display region 50, a plurality of (n-number of where n is an integer) signal lines DTL1 to DTLn are arranged in a column direction, and a plurality of (m-number of where m is an integer) scanning lines WSL1 to WSLm and a plurality of (m-number of, where m is an integer) power supply lines DSL1 to DSLm are arranged in a row direction. Moreover, each of the pixels PXLC (any one of pixels corresponding to R, G, B, and W) are disposed at an intersection of each signal line DTL and each scanning line WSL. The signal lines DTL are connected to the horizontal selector 51, and an image signal is supplied from the horizontal selector 51 to each of the signal lines DTL. The scanning lines WSL are connected to the write scanner 52, and a scanning signal (a selection pulse) is supplied from the write scanner 52 to each of the scanning lines WSL. The power supply lines DSL are connected to the power supply scanner 53, and a power supply signal (a control pulse) is supplied from the power supply scanner 53 to each of the power supply lines DSL.

Figure 36:
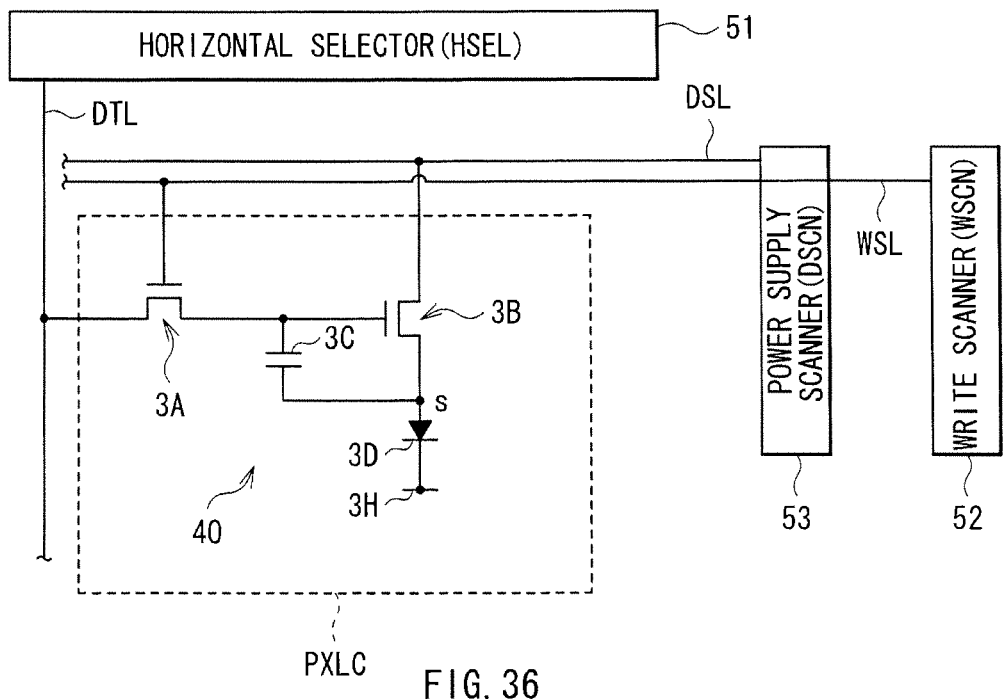
FIG. 36 is a diagram illustrating a circuit configuration of a pixel illustrated in FIG. 35.

FIG. 36 illustrates a specific circuit configuration example in the pixel PXLC. Each of the pixels PXLC includes a pixel circuit 40 including an organic EL device 5D. The pixel circuit 40 is an active type drive circuit including a sampling transistor 3A and a drive transistor 3B, a retention capacitor 3C, and the organic EL device 3D. The transistor 3A (or the transistor 3B) corresponds to the TFT 12 in the above-described embodiments and the like, and the organic EL device 3D corresponds to the organic EL device 10A in the above-described embodiments and the like.

A gate of the sampling transistor 3A is connected to the scanning line WSL corresponding thereto, and one of a source and a drain of the sampling transistor 3A is connected to the signal line DTL corresponding thereto, and the other is connected to a gate of the drive transistor 3B. A drain of the drive transistor 3B is connected to the power supply line DSL corresponding thereto, and a source of the drive transistor 3B is connected to an anode of the organic EL device 3D. Moreover, a cathode of the organic EL device 3D is connected to a ground wiring 3H. It is to be noted that the ground wiring 3H is commonly provided for all pixels PXLC. The retention capacitor 3C is disposed between the source and the gate of the drive transistor 3B.

The sampling transistor 3A is brought into conduction based on the scanning signal (the selection pulse) supplied from the scanning line WSL to sample a signal potential of an image signal supplied from the signal ling DTL and then to retain the signal potential in the retention capacitor 3C. The drive transistor 3B receives the supply of a current from the power supply line DSL set to a predetermined first potential (not illustrated) to supply a drive current to the organic EL device 3D based on the signal potential retained in the retention capacitor 3C. The organic EL device 3D emits light with luminance according to the signal potential of the image signal by the drive current supplied from the drive transistor 3B.

In such a circuit configuration, the sampling transistor 3A is brought into conduction based on the scanning signal (the selection pulse) supplied from the scanning line WSL to sample the signal potential of the image signal supplied from the signal line DTL and then to retain the signal potential in the retention capacitor 3C. Moreover, a current is supplied from the power supply line DSL set to the above-described first potential to the drive transistor 3B, and a drive current is supplied to the organic EL device 3D (each of organic EL devices of red, green and blue) based on the signal potential retained in the retention capacitor 3C. Then, each organic EL device 3D emits light with luminance according to the signal potential of the image signal based on the supplied drive current. Thus, the display unit displays an image based on the image signal.

APPLICATION EXAMPLES

Application examples to electronic apparatuses of the organic EL display units (hereinafter referred to as "display units") in the above-described first embodiment and the like will be described below. Examples of the electronic apparatuses include televisions, digital cameras, notebook personal computers, portable terminal units such as cellular phones, and video cameras. In other words, the above-described display units are applicable to electronic apparatuses, in any fields, displaying an image signal supplied from outside or an image signal produced inside as an image or a picture.

(Module)

Figure 37:
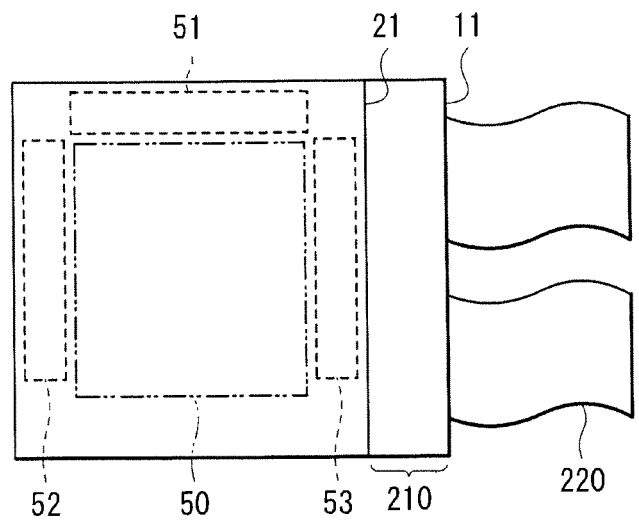
FIG. 37 is a plan view illustrating a schematic configuration of a module including the display unit illustrated in FIG. 35.

Any one of the above-described display units is incorporated into various electronic apparatuses such as Application Examples 1 to 6 which will be described later as a module as illustrated in FIG. 37. In the module, for example, a region 210 exposed from the second substrate 21 is provided on a side of the first substrate 11, and an external connection terminal (not illustrated) is formed in the exposed region 210 through extending the wiring of the horizontal selector 51, the write scanner 52, and the power supply scanner 53. In the external connection terminal, a flexible printed circuit (FPC) 220 for signal input and output may be provided.

Application Example 1

Figure 38:
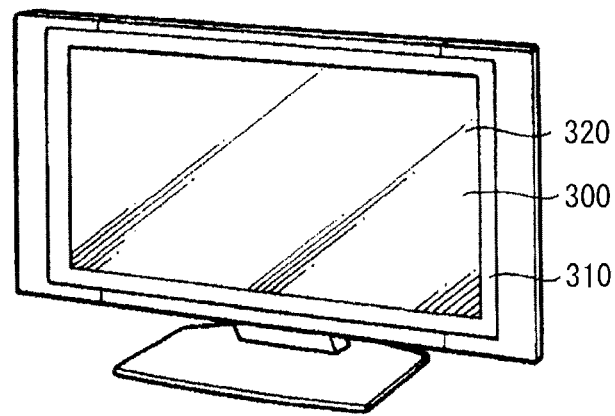
FIG. 38 is a perspective view illustrating an appearance of Application Example 1.

FIG. 38 illustrates an appearance of a television. The television includes, for example, an image display screen section 300 including a front panel 310 and a filter glass 320, and the image display screen section 300 corresponds to any one of the above-described display units.

Application Example 2

Figure 39A:
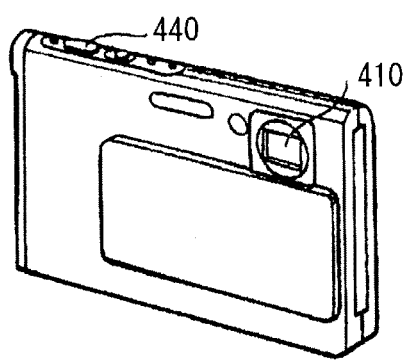
FIGS. 39A and 39B are perspective views illustrating an appearance of Application Example 2 from a front side and a back side, respectively.
Figure 39B:
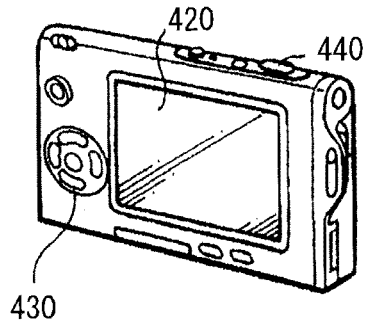

FIGS. 39A and 39B illustrate an appearance of a digital camera. The digital camera includes, for example, a light-emitting section 410 for a flash, a display section 420, a menu switch 430, and a shutter button 440, and the display section 420 corresponds to any one of the above-described display units.

Application Example 3

Figure 40:
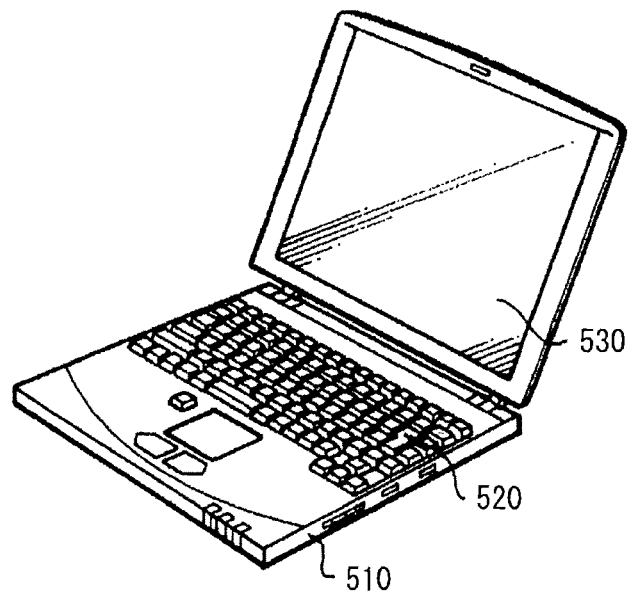
FIG. 40 is a perspective view illustrating an appearance of Application Example 3.

FIG. 40 illustrates an appearance of a notebook personal computer. The notebook personal computer includes, for example, a main body 510, a keyboard 520 for operation of inputting characters and the like, and a display section 530 for displaying an image, and the display section 530 corresponds to any one of the above-described display units.

Application Example 4

Figure 41:
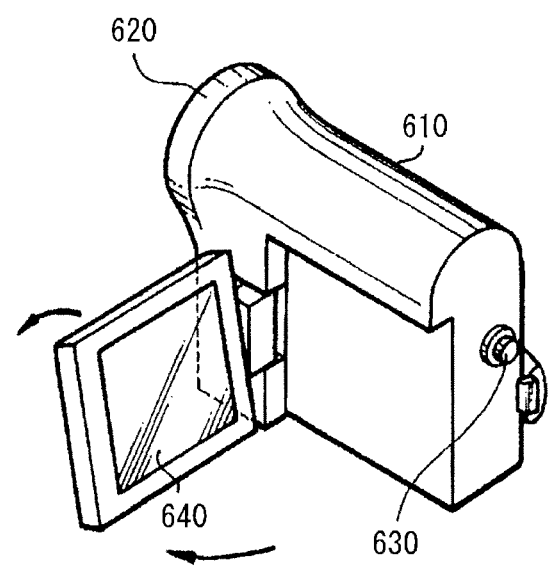
FIG. 41 is a perspective view illustrating an appearance of Application Example 4.

FIG. 41 illustrates an appearance of a video camera. The video camera includes, for example, a main body 610, a lens 620 provided on a front surface of the main body 610 and for shooting an image of an object, a shooting start/stop switch 630, and a display section 640, and the display section 640 corresponds to any one of the above-described display units.

Application Example 5

FIGS. 42A to 42G illustrate an appearance of a cellular phone. The cellular phone has a configuration in which, for example, a top-side enclosure 710 and a bottom-side enclosure 720 are connected together through a connection section (hinge section) 730, and the cellular phone includes a display 740, a sub-display 750, a picture light 760, and a camera 770. The display 740 or the sub-display 750 corresponds to any one of the above-described display units.

Application Example 6

Figure 43A:
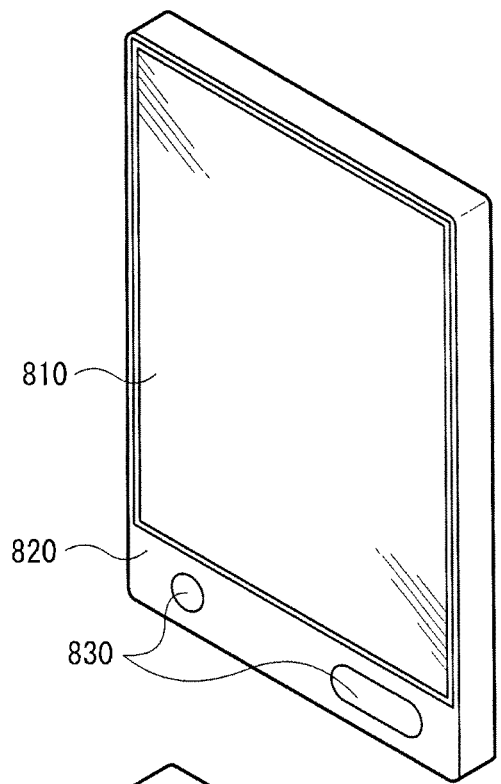
FIGS. 43A and 43B are perspective views illustrating an appearance of Application Example 6.
Figure 43B:
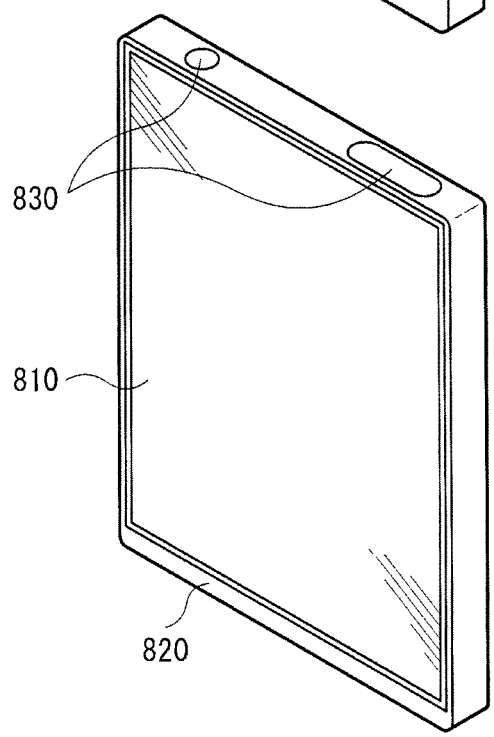

FIGS. 43A and 43B illustrate an appearance of a smartphone. The smartphone includes, for example, a display section 810 and a non-display section (enclosure) 820, and an operation section 830. The operation section 830 may be disposed on a front surface of the non-display section 820, as illustrated in FIG. 43A, or may be disposed on a top surface of the non-display section 820, as illustrated in FIG. 43B. The display section 810 corresponds to any one of the above-described display units.

Although the present disclosure is described referring to the embodiments, the modifications, and the application examples, the disclosure is not limited thereto, and may be variously modified. For example, in the above-described embodiments and the like, the material and thickness of each layer, the method and conditions of forming each layer are not limited to those described in the above-described embodiments and the like, and each layer may be made of any other material with any other thickness by any other method under any other conditions.

Moreover, in the above-described embodiments and the like, the organic EL display unit performing color display with use of sub-pixels of four colors R, G, B, and W is described as an example; however, the disclosure is not specifically limited to the organic EL display unit using sub-pixels of four colors, and may be applied to an organic EL display unit using sub-pixels of three colors R, G, and B. The disclosure is applicable to any organic EL display unit including a resin layer such as a color fitter layer and a light-shielding layer in a counter substrate.

Further, in the above-described embodiments and the like, the specific configuration of the organic EL device 10A is described; however, it is not necessary for the organic EL device 10A to include all layers, and the organic EL device 10A may further include another layer. Moreover, in the above-described embodiments and the like, the light-emitting layer in the organic layer 17 is commonly formed for respective pixels; however, the light-emitting layer may be separated for each sub-pixel, and one of light-emitting layers of colors R, G, and B may be disposed in each sub-pixel.

Moreover, for example, in the above-described embodiments and the like, the active matrix type display unit is described; however, the disclosure is applicable to a passive matrix type display unit. Further, the configuration of the pixel drive circuit for active matrix drive is not limited to that described in the above-described embodiments and the like, and the pixel drive circuit may further include a capacitor or a transistor, if necessary. In this case, in addition to the above-described horizontal selector 51 and the above-described write scanner 52, a necessary drive circuit may be further included according to a modification of the pixel drive circuit.

Further, in the above-described embodiments and the like, the top emission type organic EL display unit is described as an example; however, the organic EL display unit of the present disclosure is applicable to a bottom emission type organic EL display unit. In particular, for example, in the case where the upper electrode is configured of a high-resistance conductive film such as a transparent conductive film, the organic EL display unit of the disclosure is suitably applicable.

It is to be noted that the technology is allowed to have the following configurations.

(1) A display device comprising:
a first electrode, an organic layer including a light emitting region, and a second electrode; and
a conductive layer electrically connected to the second electrode and including an opening corresponding to the light emitting region.

(2) The display device according to Item 1, wherein a conductive film electrically connects the conductive layer to the second electrode.

(3) The display device according to Claim 2, wherein the conductive layer and at least a portion of the conductive film are spaced apart from the second electrode.

(4) The display device according to Item 2, wherein an adhesive sealing layer is formed between portions of the conductive film and the second electrode.

(5) The display device according to Item 2, wherein the conductive film is formed on a CF/BM layer including at least one of a color filter and a black matrix.

(6) The display device according to Item 2, wherein a pillar is formed between the conductive film and conductive layer, the pillar extending between the conductive layer and the second electrode and being configured so that a portion of the conductive film formed on a distal portion of the pillar contacts the second electrode.

(7) The display device according to Item 6, wherein the pillar has elasticity.

(8) The display device according to Item 1, wherein at least one color filter layer selected from a red color filter layer, a green color filter layer, and a blue color filter layer is formed in the opening.

(9) The display device according to Item 8, wherein the conductive layer is a laminate film including an inorganic light-shielding layer and a low-resistance layer, and at least a portion of the color filter layer is formed to overlap an edge of the low-resistance layer.

(10) The display device according to Item 9, wherein a conductive film is formed on the color filter layer and the low resistance layer.

(11) The display device according to Item 10, further comprising an overcoat layer formed between the conductive film and the color filter layer, and formed between the low-resistance layer and the inorganic light-shielding layer.

(12) The display device according to Item 1, wherein the conductive layer is a laminate film including an inorganic light-shielding layer and a low-resistance layer.

(13) The display device according to Item 12, wherein the inorganic light-shielding layer is selected from the group consisting of a three-layer laminate film of SiN/a-Si(amorphous silicon)/Mo and a four-layer laminate film of $MoO_x$/Mo/$MoO_x$/Mo, where in either film the outer Mo layer is closest to a low-resistance layer side.

(14) The display device according to Item 12, wherein an electrical resistivity of the low-resistance layer is lower than an electrical resistivity of the upper electrode.

(15) The display device according to Item 14, wherein the low-resistance layer includes at least one inorganic film having a lower resistivity than Mo.

(16) The display device according to Item 1, further comprising a resin light-shielding layer disposed to cover an inner wall in the opening of the conductive layer.

(17) The display device according to Item 16, wherein the resin light-shielding layer is disposed to further cover at least a portion of a surface of the conductive layer facing the second electrode.

(18) A display device comprising:
a first electrode, an organic layer, and a second electrode; and
a conductive layer electrically connected to the second electrode and being spaced apart from the second electrode.

(19) The display device according to Item 18, wherein a conductive film electrically connects the conductive layer to the second electrode.

(21) The display device according to Item 19, wherein the conductive layer and at least a portion of the conductive film are spaced apart from the second electrode.

(21) The display device according to Item 19, wherein an adhesive sealing layer is formed between portions of the conductive film and the second electrode.

(22) The display device according to Item 19, wherein the conductive film is formed on a CF/BM layer including at least one of a color filter and a black matrix.

(23) The display device according to Item 19, wherein a pillar is formed between the conductive film and conductive layer, the pillar extending between the conductive layer and the second electrode and being configured so that a portion of the conductive film formed on a distal portion of the pillar contacts the second electrode.

(24) The display device according to Item 23, wherein the pillar has elasticity.

(25) The display device according to Item 18, wherein the conductive layer is a laminate film including an inorganic light-shielding layer and a low-resistance layer.

(26) The display device according to Item 25, further comprising an overcoat layer formed between the low-resistance layer and the inorganic light-shielding layer.

(27) The display device according to Item 25, wherein the inorganic light-shielding layer is selected from the group consisting of a three-layer laminate film of SiN/a-Si(amorphous silicon)/Mo and a four-layer laminate film of $MoO_x$/Mo/$MoO_x$/Mo, where in either film the outer Mo layer is closest to a low-resistance layer side.

(28) The display device according to Item 25, wherein the electrical resistivity of the low-resistance layer is lower than the electrical resistivity of the upper electrode.

(29) The display device according to Item 28, wherein the low-resistance layer includes at least one inorganic film having a lower resistivity than Mo.

(30) A display apparatus comprising:
a display device including
a first electrode, an organic layer including a light emitting region, and a second electrode, and
a conductive layer electrically connected to the second electrode and including an opening corresponding to the light emitting region.

(31) An electronic device comprising:
a display device including
a first electrode, an organic layer including a light emitting region, and a second electrode, and
a conductive layer electrically connected to the second electrode and including an opening corresponding to the light emitting region.

(32) A method of manufacturing a display device, the method comprising:
forming a first electrode, an organic layer including a light emitting region, and a second electrode; and
forming a conductive layer electrically connected to the second electrode and including an opening corresponding to the light emitting region.

Further, it is to be noted that the technology is allowed to have the following configurations.

(1) An organic electroluminescence display unit including:
a device substrate including a first electrode, an organic layer including an organic electroluminescence layer, and a second electrode in this order on a first substrate; and
a counter substrate disposed to face the device substrate with a sealing layer in between, the counter substrate including
an inorganic light-shielding layer disposed on a second substrate, and
a conductive layer laminated on the inorganic light-shielding layer, the conductive layer being electrically connected to the second electrode of the device substrate, and being lower in resistance than the second electrode.

(2) The organic electroluminescence display unit according to (1), in which the inorganic light-shielding layer includes a laminate of a plurality of inorganic films.

(3) The organic electroluminescence display unit according to (1), further including:
a plurality of openings penetrating through the inorganic light-shielding layer and the conductive layer; and
a color filter layer provided in each of the openings.

(4) The organic electroluminescence display unit according to (3), in which the color filter layer is disposed to be filled in each of the openings and to overlap an edge of the conductive layer.

(5) The organic electroluminescence display unit according to (3) or (4), further including a resin light-shielding layer disposed to cover an inner wall of each of the openings.

(6) The organic electroluminescence display unit according to any one of (1) to (5), further including a conductive member disposed between the conductive layer and the second electrode.

(7) The organic electroluminescence display unit according to (6), in which the conductive member is one of a columnar member and a spherical member, the columnar member having conductivity at least on a surface thereof, and the spherical member having conductivity at least on a surface thereof.

(8) The organic electroluminescence display unit according to (6), in which
the conductive member includes
a filter laminate section including one or more color filters laminated on the conductive layer, and
a conductive film covering the filter laminate section.

(9) The organic electroluminescence display unit according to (6), in which the conductive member includes
a filter laminate section including one or more color filters laminated on the conductive layer,
a columnar member disposed on the filter laminate section, and
a conductive film covering the filter laminate section and the columnar member.

(10) The organic electroluminescence display unit according to any one of (1) to (9), in which the sealing layer is made of a conductive resin.

(11) The organic electroluminescence display unit according to any one of (1) to (9), in which
the sealing layer has a gap in an outer region thereof, and
a light-shielding layer is disposed in a region facing the outer region of the sealing layer.

(12) A method of manufacturing an organic electroluminescence display unit, the method including:
forming a device substrate, the device substrate including a first electrode, an organic layer including an organic electroluminescence layer, and a second electrode in this order on a first substrate;
forming a counter substrate, in which forming the counter substrate includes forming an inorganic light-shielding layer and a conductive layer in this order on a second substrate, the conductive layer being electrically connected to the second electrode of the device substrate, and being lower in resistance than the second electrode; and bonding the counter substrate onto the device substrate with a sealing layer in between.

(13) The method of manufacturing the organic electroluminescence display unit according to (12), in which forming the counter substrate includes successively forming a plurality of inorganic films and the conductive layer on the second substrate, the plurality of inorganic films configuring the inorganic light-shielding layer.

(14) The method of manufacturing the organic electroluminescence display unit according to (12) or (13), further including:

forming a plurality of openings to penetrate through the inorganic light-shielding layer and the conductive layer; and forming a color filter layer in each of the openings, in which forming the plurality of openings and forming the color filter layer are performed after forming the inorganic light-shielding layer and the conductive layer.

(15) The method of manufacturing the organic electroluminescence display unit according to (14), in which forming the plurality of openings includes collectively removing a selective region of a laminate film including the organic light-shielding layer and the conductive layer.

(16) The method of manufacturing the organic electroluminescence display unit according to (13), in which bonding the counter substrate includes pressure-bonding the device substrate and the counter substrate together with use of a resin material, an amount of the resin material being approximately 120% or less with respect to a sealing volume between the device substrate and the counter substrate.

(17) An organic electroluminescence display unit including:

a device substrate including a first electrode, an organic layer including an organic electroluminescence layer, and a second electrode in this order on a first substrate; and a counter substrate disposed to face the device substrate with a sealing layer in between, the counter substrate including a resin light-shielding layer disposed on a second substrate, a protective layer covering at least the resin light-shielding layer, and a conductive layer disposed in a region facing the resin light-shielding layer on the protective layer, the conductive layer being electrically connected to the second electrode of the device substrate, and being lower in resistance than the second electrode.

(18) A method of manufacturing an organic electroluminescence display unit, the method including:

forming a device substrate, the device substrate including a first electrode, an organic layer including an organic electroluminescence layer, and a second electrode in this order on a first substrate;

forming a counter substrate, in which forming the counter substrate includes forming a resin light-shielding layer, a protective layer, and a conductive layer in this order on a second substrate, the protective layer covering at least the resin light-shielding layer, and the conductive layer being disposed in a region facing the resin light-shielding layer, being electrically connected to the second electrode of the device substrate, and being lower in resistance than the second electrode; and bonding the counter substrate onto the device substrate with a sealing layer in between.

(19) A color filter substrate including:

an inorganic light-shielding layer disposed on a substrate;

a conductive layer laminated on the inorganic light-shielding layer;

a plurality of openings penetrating through the inorganic light-shielding layer and the conductive layer; and a color filter layer disposed in each of the openings.

(20) A color filter substrate including:

a resin light-shielding layer disposed on a substrate;

a plurality of openings penetrating through the resin light-shielding layer;

a color filter layer disposed in each of the openings;

a protective layer covering the resin light-shielding layer and the color filter layer; and a conductive layer disposed in a region facing the resin light-shielding layer on the protective layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The application is claimed as follows:

1. A display device comprising:
    a device substrate including a light emitting element formed thereon, and a counter substrate opposed to the device substrate;
    an organic layer including a light emitting region, a first electrode formed between the organic layer and the device substrate, and a second electrode formed between the organic layer and the counter substrate; and
    a conductive layer formed on the counter substrate, electrically connected to the second electrode, and including an opening corresponding to the light emitting region,
    wherein the conductive layer is a laminate film including an inorganic light-shielding layer and a low-resistance layer,
    wherein at least one color filter layer selected from a red color filter layer, a green color filter layer, and a blue color filter layer is formed in the opening,
    wherein the conductive layer is a laminate film including an inorganic light-shielding layer and a low-resistance layer, and at least a portion of the color filter layer is formed to overlap an edge of the low-resistance layer,
    wherein a conductive film is formed on the color filter layer and the low resistance layer, and
    further comprising an overcoat layer formed between the conductive film and the color filter layer, and formed between the low-resistance layer and the inorganic light-shielding layer.

2. The display device according to claim 1, wherein a conductive film electrically connects the conductive layer to the second electrode.

3. The display device according to claim 2, wherein the conductive layer and at least a portion of the conductive film are spaced apart from the second electrode.

4. The display device according to claim 2, wherein an adhesive sealing layer is formed between portions of the conductive film and the second electrode.

5. The display device according to claim 2, wherein the conductive film is formed on a CF/BM layer including at least one of a color filter and a black matrix.

6. The display device according to claim 2, wherein a pillar is formed between the conductive film and conductive layer, the pillar extending between the conductive layer and the second electrode and being configured so that a portion of the conductive film formed on a distal portion of the pillar contacts the second electrode.

7. The display device according to claim 6, wherein the pillar has elasticity.

8. The display device according to claim 1, wherein the inorganic light-shielding layer is selected from the group consisting of a three-layer laminate film of SiN/a-Si(amorphous silicon)/Mo and a four-layer laminate film of $MoO_x$/Mo/$MoO_x$/Mo, where in either film the outer Mo layer is closest to a low-resistance layer side.

9. The display device according to claim 1, wherein an electrical resistivity of the low-resistance layer is lower than an electrical resistivity of the second electrode.

10. The display device according to claim 9, wherein the low-resistance layer includes at least one inorganic film having a lower resistivity than Mo.

11. The display device according to claim 1, further comprising a resin light-shielding layer disposed to cover an inner wall in the opening of the conductive layer.

12. The display device according to claim 11, wherein the resin light-shielding layer is disposed to further cover at least a portion of a surface of the conductive layer facing the second electrode.

13. A display apparatus comprising:
   a display device including
      a device substrate including a light emitting element formed thereon, and a counter substrate opposed to the device substrate,
      an organic layer including a light emitting region, a first electrode formed between the organic layer and the device substrate, and a second electrode formed between the organic layer and the counter substrate, and
      a conductive layer formed on the counter substrate, electrically connected to the second electrode, and including an opening corresponding to the light emitting region,
   wherein the conductive layer is a laminate film including an inorganic light-shielding layer and a low-resistance layer,
   wherein at least one color filter layer selected from a red color filter layer, a green color filter layer, and a blue color filter layer is formed in the opening,
   wherein the conductive layer is a laminate film including an inorganic light-shielding layer and a low-resistance layer, and at least a portion of the color filter layer is formed to overlap an edge of the low-resistance layer,
   wherein a conductive film is formed on the color filter layer and the low resistance layer, and
   further comprising an overcoat layer formed between the conductive film and the color filter layer, and formed between the low-resistance layer and the inorganic light-shielding layer.

14. An electronic device comprising:
   a display device including
      a device substrate including a light emitting element formed thereon, and a counter substrate opposed to the device substrate,
      an organic layer including a light emitting region, a first electrode formed between the organic layer and the device substrate, and a second electrode formed between the organic layer and the counter substrate, and
      a conductive layer formed on the counter substrate, electrically connected to the second electrode, and including an opening corresponding to the light emitting region,
   wherein the conductive layer is a laminate film including an inorganic light-shielding layer and a low-resistance layer,
   wherein at least one color filter layer selected from a red color filter layer, a green color filter layer, and a blue color filter layer is formed in the opening,
   wherein the conductive layer is a laminate film including an inorganic light-shielding layer and a low-resistance layer, and at least a portion of the color filter layer is formed to overlap an edge of the low-resistance layer,
   wherein a conductive film is formed on the color filter layer and the low resistance layer, and
   further comprising an overcoat layer formed between the conductive film and the color filter layer, and formed between the low-resistance layer and the inorganic light-shielding layer.

* * * * *